US009847306B2

United States Patent
Lin et al.

(10) Patent No.: US 9,847,306 B2
(45) Date of Patent: Dec. 19, 2017

(54) CIRCUIT BOARD HAVING A GROUND LAYER INCLUDING A PLURALITY OF POLYGONAL OPENINGS

(71) Applicant: KABUSHIKI KAISHA TOSHIBA, Tokyo (JP)

(72) Inventors: Fongru Lin, Yokohama Kanagawa (JP); Yoshihiro Iida, Minato Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/448,443

(22) Filed: Mar. 2, 2017

(65) Prior Publication Data

US 2017/0271282 A1    Sep. 21, 2017

Related U.S. Application Data

(60) Provisional application No. 62/309,423, filed on Mar. 16, 2016.

(51) Int. Cl.
| | | |
|---|---|---|
| H01L 23/00 | (2006.01) | |
| H01L 23/66 | (2006.01) | |
| H01L 23/552 | (2006.01) | |
| H01L 23/498 | (2006.01) | |
| H05K 1/18 | (2006.01) | |
| H01L 23/495 | (2006.01) | |

(52) U.S. Cl.
CPC .......... *H01L 23/66* (2013.01); *H01L 23/4985* (2013.01); *H01L 23/49531* (2013.01); *H01L 23/49822* (2013.01); *H01L 23/49838* (2013.01); *H01L 23/552* (2013.01); *H01L 24/16* (2013.01); *H05K 1/189* (2013.01); *H01L 2223/6638* (2013.01); *H01L 2224/16227* (2013.01); *H01L 2224/32225* (2013.01); *H01L 2224/48227* (2013.01); *H01L 2224/49109* (2013.01)

(58) Field of Classification Search
CPC . H01L 2224/48227; H01L 2224/32225; H01L 2224/49109; H01L 23/49531
See application file for complete search history.

(56) References Cited

U.S. PATENT DOCUMENTS

| | | | |
|---|---|---|---|
| 5,519,176 A * | 5/1996 | Goodman | ......... H01L 23/49822 174/250 |
| 9,549,460 B2 | 1/2017 | Watanabe et al. | |
| 2002/0079562 A1* | 6/2002 | Zhao | .................. H01L 23/4334 257/678 |

(Continued)

FOREIGN PATENT DOCUMENTS

| | | |
|---|---|---|
| JP | H07321463 A | 12/1995 |
| JP | 2006086293 A | 3/2006 |

(Continued)

*Primary Examiner* — Ngan Ngo
(74) *Attorney, Agent, or Firm* — Patterson & Sheridan, LLP

(57) ABSTRACT

A circuit board includes an insulating layer, a ground layer formed on a first surface of the insulating layer and including a plurality of openings arranged in first and second surface directions, each of the openings having a shape of a polygon having five or more sides, and a wiring layer formed on a second surface of the insulating layer opposite to the first surface.

20 Claims, 23 Drawing Sheets

(56) References Cited

U.S. PATENT DOCUMENTS

| | | | |
|---|---|---|---|
| 2003/0214443 A1* | 11/2003 | Bauregger | H01Q 1/38 343/700 MS |
| 2007/0004094 A1* | 1/2007 | Takiar | H01L 23/49838 438/125 |
| 2015/0214174 A1* | 7/2015 | Kawano | H01L 24/17 257/737 |
| 2016/0307853 A1 | 10/2016 | Fukuchi et al. | |
| 2016/0323996 A1* | 11/2016 | Takemura | G01R 1/07378 |

FOREIGN PATENT DOCUMENTS

| | | |
|---|---|---|
| JP | 2013171863 A | 9/2013 |
| JP | 5690428 B1 | 3/2015 |
| JP | 2015138876 A | 7/2015 |

\* cited by examiner

CIRCUIT BOARD HAVING A GROUND LAYER INCLUDING A PLURALITY OF POLYGONAL OPENINGS

CROSS-REFERENCE TO RELATED APPLICATIONS

This application is based upon and claims the benefit of priority from U.S. Provisional Patent Application No. 62/309,423, filed on Mar. 16, 2016, the entire contents of which are incorporated herein by reference.

FIELD

Embodiments described herein relate generally to a board.

BACKGROUND

Boards including a ground layer and a signal layer are known.

DETAILED DESCRIPTION OF THE INVENTION

Figure 1:
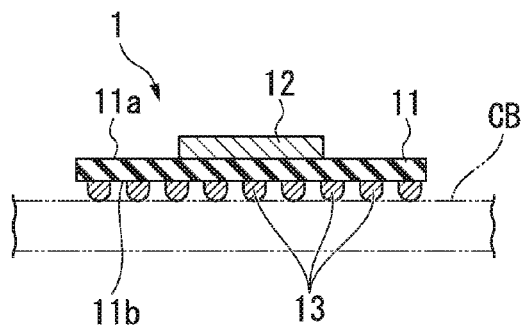
FIG. 1 is a cross-sectional view of a semiconductor device according to a first embodiment.

A circuit board includes an insulating layer, a ground layer formed on a first surface of the insulating layer and including a plurality of openings arranged in first and second surface directions, each of the openings having a shape of a polygon having five or more sides, and a wiring layer formed on a second surface of the insulating layer opposite to the first surface.

Hereinafter, a semiconductor device and a board of embodiments will be described with reference to the drawings. In the following description, configurations having the same or similar functions are assigned the same reference numerals. Redundant description thereof may be omitted.

First Embodiment

A first embodiment will be described with reference to FIGS. 1 to 12.

A ground layer of a board of the present embodiment has a plurality of openings. Each of the plurality of openings is formed as a regular polygon having five or more corners. Since each of the plurality of openings is formed as the regular polygon having five or more corners, a variation in a degree of overlap between a ground layer and a conductive line due to a position or a direction of the conductive line can be reduced more than when the opening is rectangular. Thus, an impedance design of the board may become more flexible. Hereinafter, this advantage will be described in detail.

FIG. 1 is a cross-sectional view of a semiconductor device 1 according to the first embodiment.

As illustrated in FIG. 1, the semiconductor device 1 (e.g., a semiconductor package or a semiconductor component) includes, for example, a board 11, a semiconductor chip 12, and a plurality of solder balls 13.

The board 11 is a base board (e.g., a package board) on which the semiconductor chip 12 is mounted. The board 11 is a so-called multilayer board. The board 11 includes an insulator layer 21, a ground layer 23, and a signal layer 22 stacked in this order (see FIG. 5). Also, as illustrated in FIG. 1, the board 11 has a first surface 11a and a second surface 11b opposite to the first surface 11a. The board 11 will be described in detail below.

The semiconductor chip 12 is mounted on the first surface 11a of the board 11. The semiconductor chip 12 is, for example, a controller chip, a memory chip, or a sensor chip, but is not limited thereto. It is only necessary for the semiconductor chip 12 to be a chip including a semiconductor material in at least a part thereof An example of the semiconductor chip 12 is an electronic device which operates according to a differential signal. For example, the semiconductor chip 12 receives the differential signal from a circuit board CB via the solder balls 13 and the board 11. Also, the semiconductor chip 12 generates a differential signal. The semiconductor chip 12 sends the generated differential signal to the circuit board CB via the board 11 and the solder balls 13.

The semiconductor chip 12 may be formed of, for example, one device. Alternatively, the semiconductor chip 12 may include a plurality of devices and a mold which integrally covers the plurality of devices. The semiconductor chip 12 (or each device included in the semiconductor chip 12) may be electrically connected to the board 11 by wire bonding, solder balls, or metal bumps.

The plurality of solder balls 13 is provided on a second surface 11b of the board 11. The plurality of solder balls 13 is connected to conductive pads of the circuit board (e.g., a main board) CB. That is, the semiconductor device 1 is electrically connected to the circuit board CB via the plurality of solder balls 13. One of the plurality of solder balls 13 is an example of an external connection terminal of the semiconductor device 1. The external connection terminal of the semiconductor device 1 is not limited to the solder ball 13, but may be a metal bump, a conductive pad, or the like.

Next, the board 11 will be described in detail.

Figure 2:
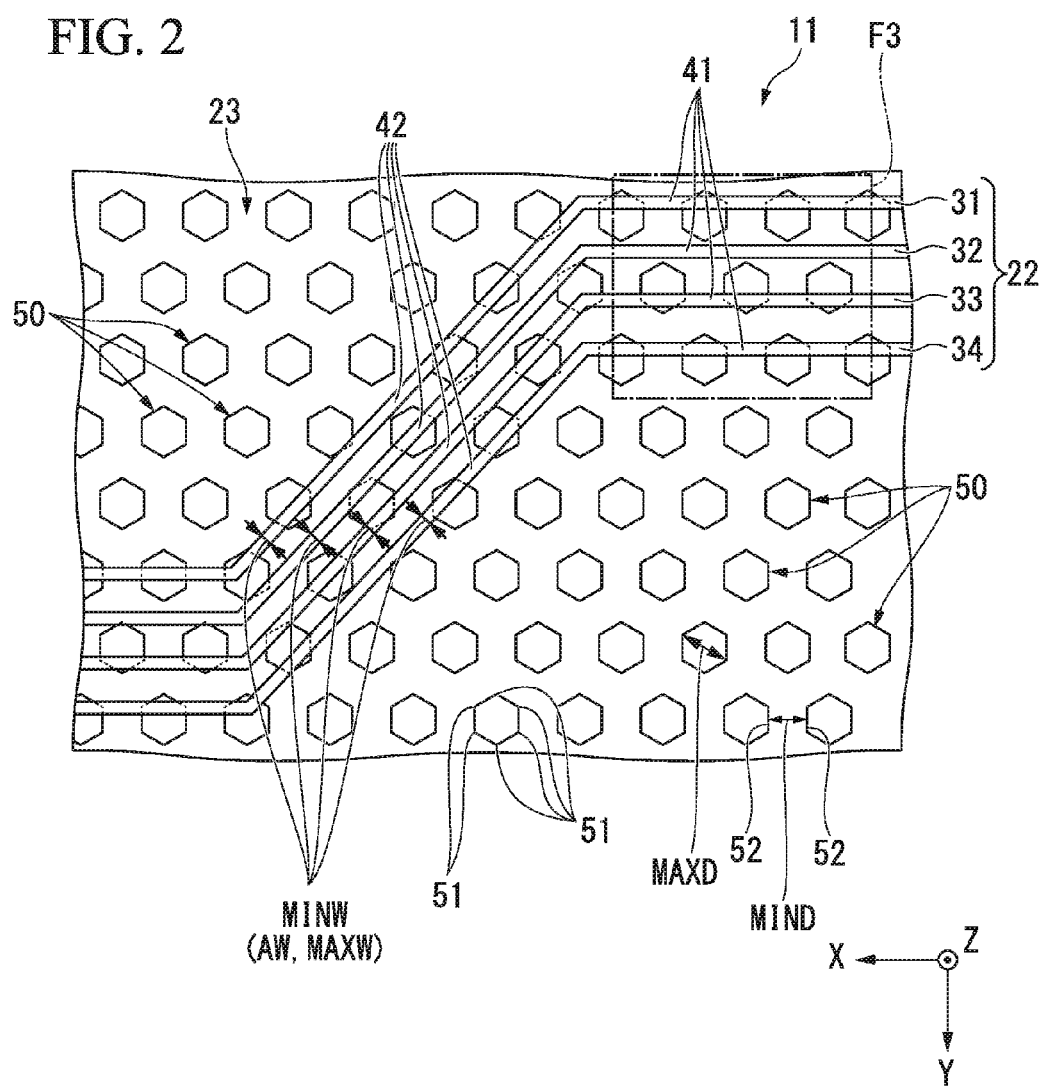
FIG. 2 is a plan view of a board according to the first embodiment.
Figure 3:
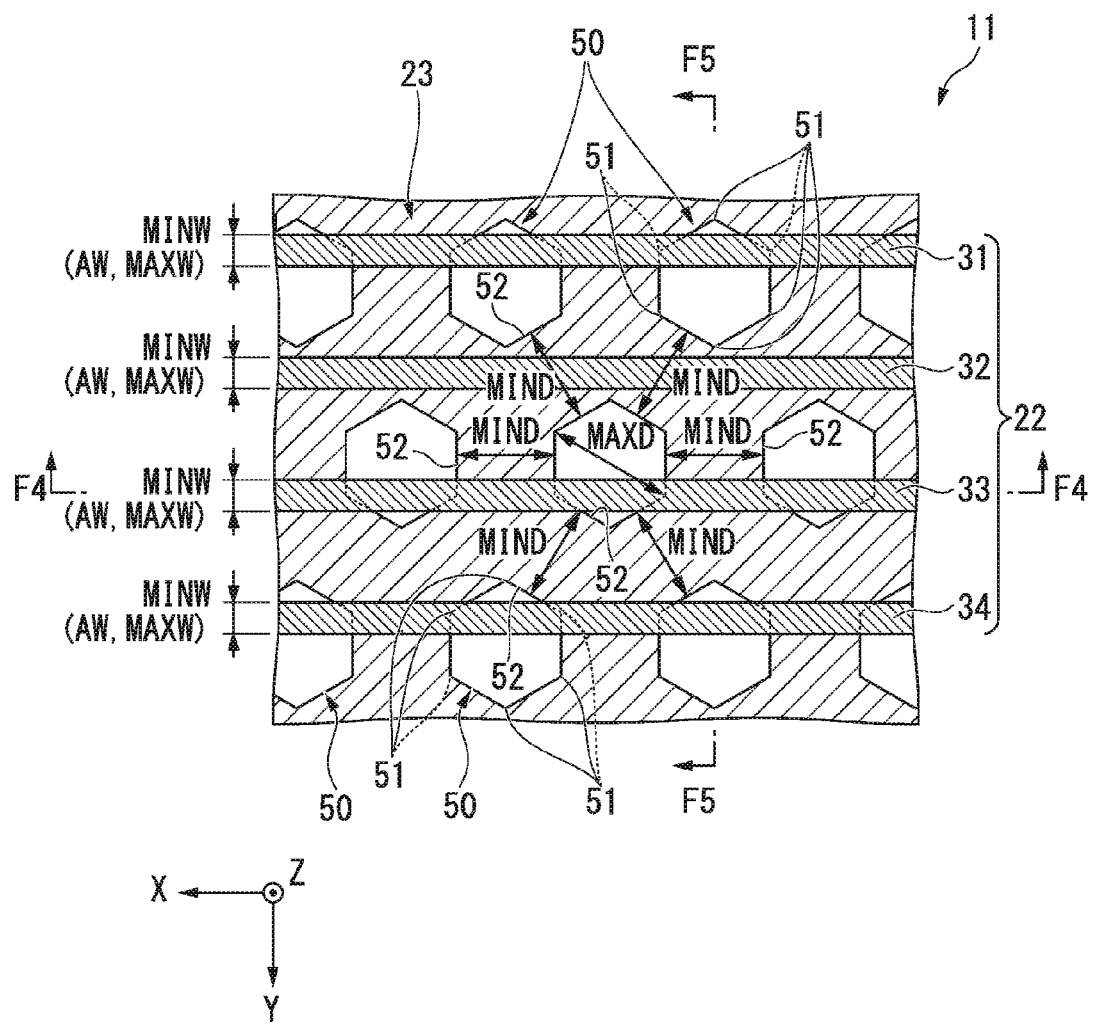
FIG. 3 is an enlarged plan view of a part of the board surrounded by a line F3 illustrated in FIG. 2.
Figure 4:
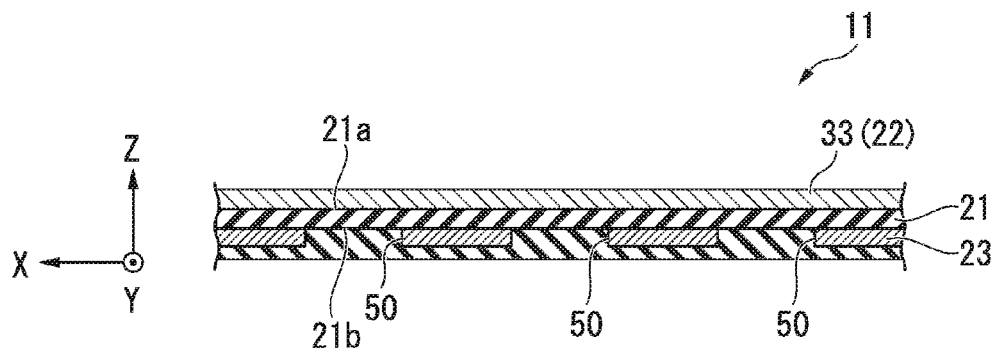
FIG. 4 is a cross-sectional view of the board taken along a line F4-F4 illustrated in FIG. 3.
Figure 5:
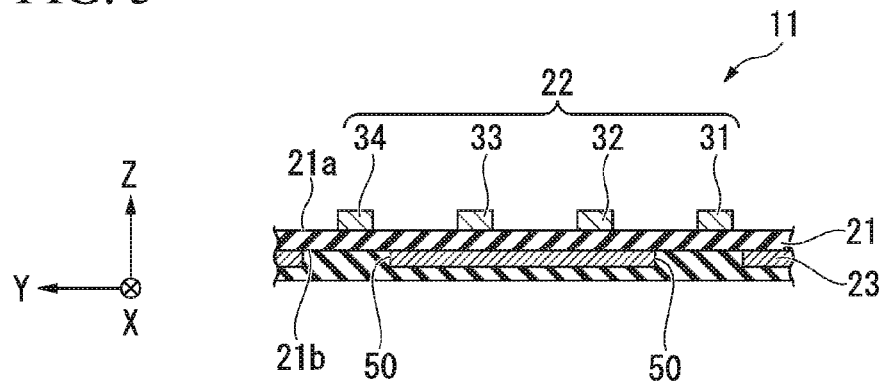
FIG. 5 is a cross-sectional view of the board taken along a line F5-F5 illustrated in FIG. 3.

FIG. 2 is a plan view of the board 11 according to the present embodiment. In FIG. 2, the insulator layer 21 is omitted and the layouts of a plurality of signal lines 31, 32, 33, and 34 and the ground layer 23 are illustrated. FIG. 3 is an enlarged plan view of a region of the board 11 surrounded by a line F3 illustrated in FIG. 2. In FIG. 3, for convenience of description, the plurality of signal lines 31, 32, 33, and 34 and the ground layer 23 are hatched. FIG. 4 is a cross-sectional view of the board 11 taken along a line F4-F4 illustrated in FIG. 3. FIG. 5 is a cross-sectional view of the board 11 taken along a line F5-F5 illustrated in FIG. 3.

Here, X, Y, and Z directions are defined. X and Y directions are directions along a first surface 21a of the insulator layer 21. Y direction is a direction intersecting (e.g., substantially orthogonal to) X direction. Z direction is a direction intersecting (e.g., substantially orthogonal to) X direction and Y direction. Z direction is a thickness direction of the board 11 (e.g., a thickness direction of the ground layer 23).

As illustrated in FIGS. 4 and 5, the board 11 includes the insulator layer 21, the signal layer 22, and the ground layer 23. Also, the board 11 may include more layers, but only some layers included in the board 11 are illustrated for simplification of illustration in FIGS. 4 and 5.

The insulator layer 21 is formed in a planar shape (e.g., a sheet shape) extending in X direction and Y direction. The insulator layer 21 is formed of a material (e.g., a glass epoxy resin) having an electrical insulation characteristic. Thereby, the insulator layer 21 electrically insulates the signal layer 22 and the ground layer 23. The insulator layer 21 has a first surface 21a and a second surface 21b positioned opposite to the first surface 21a.

Next, the signal layer 22 will be described.

As illustrated in FIG. 5, the signal layer 22 is provided on the first surface 21a of the insulator layer 21. The signal layer 22 includes the plurality of signal lines 31, 32, 33, and 34. The plurality of signal lines 31, 32, 33, and 34 is formed on the first surface 21a of the insulator layer 21. For example, each of the plurality of signal lines 31, 32, 33 and 34 is formed by etching a copper layer (e.g., a copper foil) provided on the first surface 21a of the insulator layer 21. Each of the plurality of signal lines 31, 32, 33 and 34 is an example of a "conductive line." The "conductive line" described in the present application is not limited to the signal line, and may be a power line through which power is supplied to the semiconductor chip 12 or another component.

As illustrated in FIG. 2, the plurality of signal lines 31, 32, 33, and 34 includes a first signal line 31, a second signal line 32, a third signal line 33, and a fourth signal line 34. Each of the first to fourth signal lines 31, 32, 33, and 34 is electrically connected to the semiconductor chip 12, for example, via a via and a conductive pad formed on the board 11. Each of the first to fourth signal lines 31, 32, 33, and 34 receives a signal (e.g., a differential signal) from the circuit board CB and passes the signal toward the semiconductor chip 12. Further, each of the first to fourth signal lines 31, 32, 33, and 34 receives a signal (e.g., a differential signal) generated by the semiconductor chip 12 from the semiconductor chip 12 and passes the signal to the circuit board CB.

As illustrated in FIG. 2, the first to fourth signal lines 31, 32, 33, and 34 at least partially extend substantially parallel to each other. For example, each of the first to fourth signal lines 31, 32, 33, and 34 includes a first part 41 and a second part 42. The first part 41 extends, for example, in X direction. For example, first parts 41 of the first to fourth signal lines 31, 32, 33, and 34 extend substantially parallel to each other. On the other hand, the second part 42 extends in a direction intersecting a direction in which the first part 41 extends. For example, second parts 42 of the first to fourth signal lines 31, 32, 33, and 34 extend substantially parallel to each other.

For example, the first and second signal lines 31 and 32 have substantially the same wiring length. For example, the first and second signal lines 31 and 32 form a pair of signal lines through which differential signals flow. The first and second signal lines 31 and 32 receive the differential signals generated by the semiconductor chip 12 from the semiconductor chip 12.

Likewise, the third and fourth signal lines 33 and 34 have substantially the same wiring length. The third and fourth signal lines 33 and 34 form a pair of signal lines through which differential signals flow. For example, the third and fourth signal lines 33 and 34 receive differential signals generated by the semiconductor chip 12 from the semiconductor chip 12.

However, signals flowing through the first to fourth signal lines 31, 32, 33, and 34 are not limited to the differential signals and may be single-ended signals, etc.

Next, the ground layer 23 will be described.

As illustrated in FIGS. 4 and 5, the ground layer 23 is positioned opposite to the signal layer 22 (e.g., a plurality of signal lines 31, 32, 33, and 34) with respect to the insulator layer 21. In the present embodiment, the ground layer 23 is formed on the second surface 21b of the insulator layer 21.

As illustrated in FIG. 2, the ground layer 23 is formed in a planar shape (e.g., a sheet shape) extending in X direction and Y direction. For example, the ground layer 23 is formed of a copper layer (e.g., a copper foil) provided on the second surface 21b of the insulator layer 21. For example, the ground layer 23 is electrically connected to a ground of an outside (e.g., the circuit board CB) via the solder ball 13 and set to at a ground potential. The ground layer 23 is electrically connected to the semiconductor chip 12 via a via and a conductive formed on the board 11. The ground layer 23 is used to supply a reference potential to the semiconductor chip 12. That is, the ground layer 23 functions as a reference ground (e.g., a reference ground for the differential signal). Also, in place thereof, the ground layer 23 may be, for example, a ground layer provided to adjust (e.g., increase/decrease) an impedance (e.g., characteristic impedance) of the signal layer 22 (e.g., the first to fourth signal lines 31, 32, 33, and 34). Further, in place thereof, the ground layer 23 may be a ground layer provided to suppress electro-magnetic interference (EMI) of the signal layer 22 (e.g., the first to fourth signal lines 31, 32, 33, and 34).

As illustrated in FIG. 2, the ground layer 23 of the present embodiment has a plurality of openings 50. Each opening 50 penetrates through the ground layer 23 in Z direction. The plurality of openings 50 is arranged to be separated from one another at intervals (e.g., substantially equal intervals) between the openings 50. The plurality of openings 50 are arranged in a plurality of directions (e.g., X direction and a direction intersecting X direction). Thereby, the ground layer 23 is formed by a conductive layer of the remaining region after a conductive layer is removed from regions corresponding to the openings 50. From another viewpoint, the ground layer 23 has a mesh structure. In the present application, the "mesh structure" indicates that the ground layer 23 has openings 50 arranged in a plurality of directions and the whole of the layer 23 is integrally connected.

Next, sizes, shapes, arrangements, etc. of the openings 50 will be described in detail.

As illustrated in FIG. 3, each of the plurality of openings 50 has at least five or more corners 51. For example, each of the plurality of openings 50 has at least six or more corners 51. The "corners" in the present application are points at which two lines meet or intersect. The above-described two lines may be two straight lines, two curved lines, or a combination of one straight line and one curved line.

In the present embodiment, each of the plurality of openings 50 is formed in a regular polygon. In the present embodiment, each of the plurality of openings 50 is formed as a regular hexagon. In the present embodiment, the plurality of openings 50 is arranged so that sides included in contours of the regular hexagons confront each other. That is, the sides included in the contours of the regular hexagons extend substantially parallel to each other. Also, as will be described below, the plurality of openings 50 may be arranged so that vertices (corners 51) included in the contours of the regular hexagons confront each other (see FIG. 13). In the present embodiment, the plurality of openings 50 has substantially the same shape as one another. In the present embodiment, the plurality of openings 50 has substantially the same size as one another.

Figure 6A:
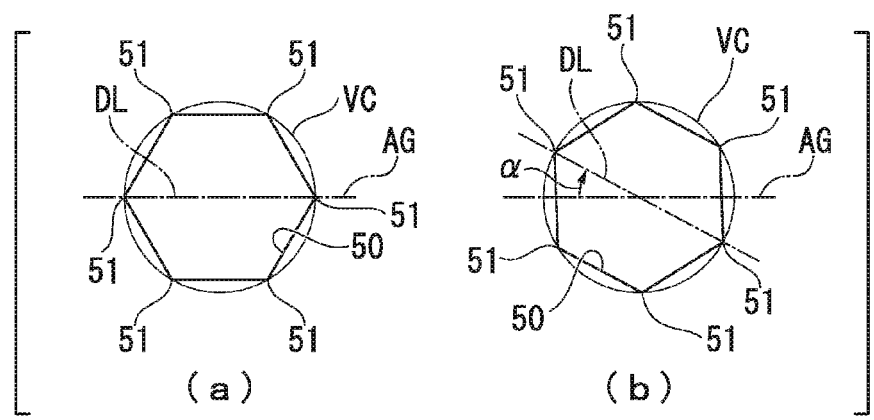
FIG. 6A is a plan view of an opening according to the first embodiment.
Figure 6B:
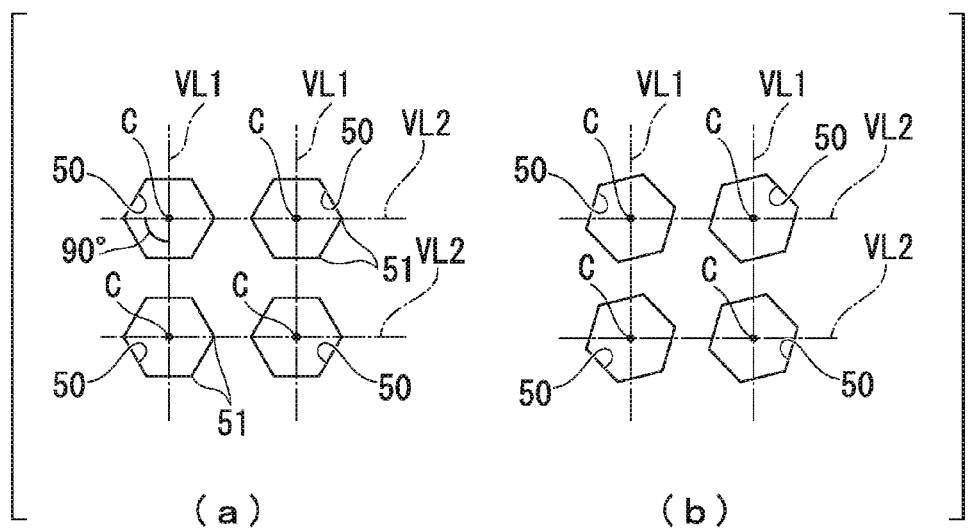
FIG. 6B is a plan view of a 90-degree arrangement pattern of openings according to the first embodiment.
Figure 6C:
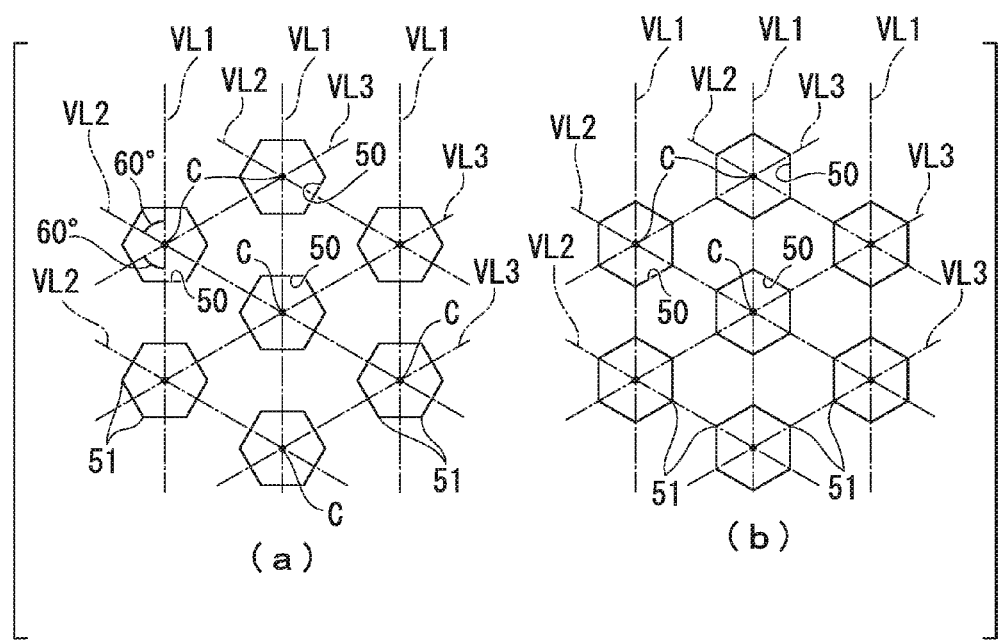
FIG. 6C is a plan view of a 60-degree arrangement pattern of the openings according to the first embodiment.
Figure 6D:
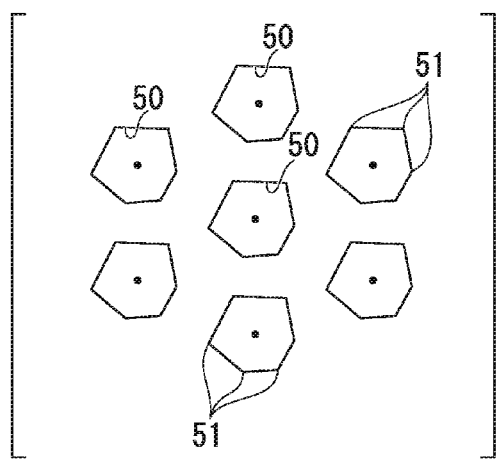
FIG. 6D is a plan view of an opening according to a modified example of the first embodiment.

Here, angles of orientation and an arrangement scheme of the openings 50 will be described. FIG. 6A is a plan view of an opening 50. FIG. 6B is a plan view of a 90-degree arrangement pattern of the openings 50. FIG. 6C is a plan view of a 60-degree arrangement pattern of the openings 50. FIG. 6D is a plan view of the openings 50 according to a modified example.

First, the angle of orientation of the opening 50 will be described.

(a) of FIG. 6A illustrates a standard shape of the opening 50. In the opening 50 in FIG. 6A, one diagonal line DL selected from diagonal lines connecting the most distant vertices (corners 51) of the opening 50 extends along one preset angle reference line AG. Thus, the case in which the angle reference line AG substantially matches the above-described diagonal line DL is the case in which the angle of orientation is 0 degrees. (b) of FIG. 6A illustrates the opening 50 arranged at an angle of orientation α. As illustrated in (b) of FIG. 6A, the arrangement at the angle of orientation α indicates that an angle between the angle reference line AG and the above-described diagonal line DL is α.

Next, a 90-degree arrangement pattern of the openings 50 will be described.

(a) of FIG. 6B illustrates a 90-degree arrangement pattern when the angle of orientation is 0 degrees. In this 90-degree arrangement pattern, the openings 50 are positioned in correspondence with intersections between a plurality of first virtual lines VL1 extending substantially parallel to each other and a plurality of second virtual lines VL2 substantially extending substantially parallel to each other and being orthogonal to the plurality of first virtual lines VL1. The term "positioned in correspondence with" indicates that centers C of the openings 50 substantially match the above-described intersections. "Centers of the openings" indicates center points of virtual circles VC passing through pluralities of corners 51 of the openings 50 when the openings 50 are regular polygons (see FIG. 6A). If the openings 50 are non-regular polygons, "centers of the openings" indicates centers of gravity of the openings 50 when the openings 50 are regarded as real objects. In the plurality of openings 50, a distance between centers (a distance between center points C) of a plurality of the openings 50 (e.g., two of the openings 50 adjacent to each other) is shortest in a direction along the first virtual line VL1 and a direction along the second virtual line VL2. Also, (b) of FIG. 6B illustrates a 90-degree arrangement pattern when the angle of orientation is 45 degrees.

Next, a 60-degree arrangement pattern of the openings 50 will be described.

(a) of FIG. 6C illustrates a 60-degree arrangement pattern when the angle of orientation is 0 degrees. In this 60-degree arrangement pattern, the openings 50 are positioned in correspondence with intersections between a plurality of first virtual lines VL1 extending substantially parallel to each other and a plurality of second virtual lines VL2 extending substantially parallel to each other and intersecting the plurality of first virtual lines VL1 at an angle of substantially 60 degrees. From another viewpoint, the openings 50 are positioned in correspondence with intersections between a plurality of first virtual lines VL1 extending substantially parallel to each other, a plurality of second virtual lines VL2 extending substantially parallel to each other and intersecting the plurality of first virtual lines VL1 at an angle of about 60 degrees, and a plurality of third virtual lines VL3 extending substantially parallel to each other and intersecting the plurality of first virtual lines VL1 and the plurality of second virtual lines VL2 at an angle of about 60 degrees. In the plurality of openings 50, a distance between centers (a distance between center points C) of a plurality of the openings 50 (e.g., two of the openings 50 adjacent to each other) is shortest in a direction along the first virtual line VL1, a direction along the second virtual line VL2, and the third virtual line VL3. Also, (b) of FIG. 6C illustrates a 60-degree arrangement pattern when the angle of orientation is 30 degrees.

In the present embodiment, the plurality of openings 50 is arranged, for example, in the 60-degree arrangement pattern of the angle of orientation of 0 degrees. The angles of orientation of the plurality of openings 50 may be any angles. The plurality of openings 50 may be arranged in the 90-degree arrangement pattern. Even when the 90-degree arrangement pattern is adopted, the angles of orientation of the plurality of openings 50 may be any angles (here, may be angles different from substantially 45 degrees, for example, in the case of the regular hexagons). In an example, in the case of the 90-degree arrangement pattern, all diagonal lines DL connecting the most distant vertices (corners 51) in each of the plurality of openings 50 may be tilted by an angle different from substantially 45 degrees to the first virtual line VL1. Also, these variations are also applicable to all of the following embodiments.

FIG. 6D illustrates a modified example of the openings 50. As illustrated in FIG. 6D, in the present embodiment and all the following embodiments, the openings 50 may be non-regular polygons having pluralities of corners 51. Even when the openings 50 are the non-regular polygons, all the above-described variations (e.g., any angle of orientation in the 90-degree arrangement pattern and any angle of orientation in the 60-degree arrangement pattern) may be applied.

As illustrated in FIG. 3, each of the plurality of openings 50 has a maximum dimension MAXD in a plane along the insulator layer 21 (e.g., the second surface 21b of the insulator layer 21). The "maximum dimension" in the present application is a distance between two points farthest from each other positioned on the contour of the opening 50. For example, the maximum dimension MAXD is a distance between two diagonally positioned corners 51 of the opening 50.

Here, each of the first to fourth signal lines 31, 32, 33, and 34 has a certain average width AW. The "average width" in the present application indicates an average value of a line width in the entire length of a line. For example, the "average width" is a value obtained by dividing a sum of widths at positions of the line for the entire length of the line by the numbers of the positions. For example, when the line has a fixed width for the entire length of the line, the width corresponds to the "average width." Also, average widths of the first to fourth signal lines 31, 32, 33, and 34 may be substantially the same as each other or may be different from each other.

As illustrated in FIG. 3, in the present embodiment, the maximum dimension MAXD of each of the openings 50 may be greater than the average width AW of each of the first to fourth signal lines 31, 32, 33, and 34.

From another viewpoint, each of the first to fourth signal lines 31, 32, 33, and 34 has a minimum width MINW and a maximum width MAXW. The "minimum width" in the present application indicates a minimum value of a width of a line in the entire length of the line. The "maximum width" in the present application indicates a maximum value of a width of a line in the entire length of the line. For example, when the line has a fixed width for the entire length of the line, the "maximum width" and the "minimum width" match the "average width." In the present embodiment, the maximum dimension MAXD of each of the openings 50 may be greater than the minimum width MINW of each of the first to fourth signal lines 31, 32, 33, and 34. Also, in one example, the maximum dimension MAXD of each of the openings 50 may be greater than the maximum width MAXW of each of the first to fourth signal lines 31, 32, 33, and 34.

As illustrated in FIG. 2, the plurality of openings 50 includes pairs of two openings 50 adjacent to each other. The two openings 50 of each pair include mutually confronting edges 52. Each pair has a minimum distance MIND between the edges 52 of the two openings 50. The minimum distance MIND of each pair may be greater than the minimum width MINW of each of the first to fourth signal lines 31, 32, 33, and 34. Also, in an example, the minimum distance MIND of each pair may be greater than the average width AW (or the maximum width MAXW) of each of the first to fourth signal lines 31, 32, 33, and 34.

As illustrated in FIG. 2, the plurality of openings 50 is substantially uniformly discrete and provided throughout the ground layer 23. Some openings 50 included in the plurality of openings 50 overlap a first part 41 of at least any one of the first to fourth signal lines 31, 32, 33, and 34 when viewed in Z direction (e.g., when seen through in Z direction). Also, other openings 50 included in the plurality of openings 50 overlap a second part 42 of at least any one of the first to fourth signal lines 31, 32, 33, and 34 when viewed in Z direction.

For example, each of the first to fourth signal lines 31, 32, 33, and 34 overlaps at least one corner 51 included in the above-described regular hexagon in at least one of the plurality of openings 50 when viewed in Z direction. In the present embodiment, each of the first to fourth signal lines 31, 32, 33, and 34 overlaps at least two corners 51 included in the above-described regular hexagon in at least one of the plurality of openings 50 when viewed in Z direction. From another viewpoint, in the present embodiment, each of the first to fourth signal lines 31, 32, 33, and 34 overlaps at least one corner 51 included in the above-described regular hexagon in at least two of the plurality of openings 50 when viewed in Z direction. However, each of the first to fourth signal lines 31, 32, 33, and 34 may not overlap the openings 50.

Next, a simulation for comparing a difference of an electrical characteristic (e.g., a transmission characteristic) of a signal line due to opening shapes will be described.

Figure 7A:
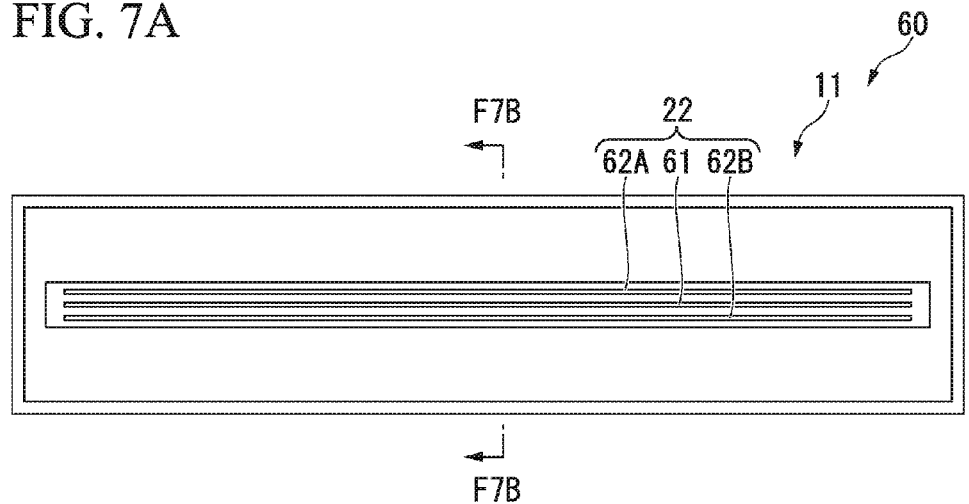
FIG. 7A illustrates a simulation model according to the first embodiment.
Figure 7B:
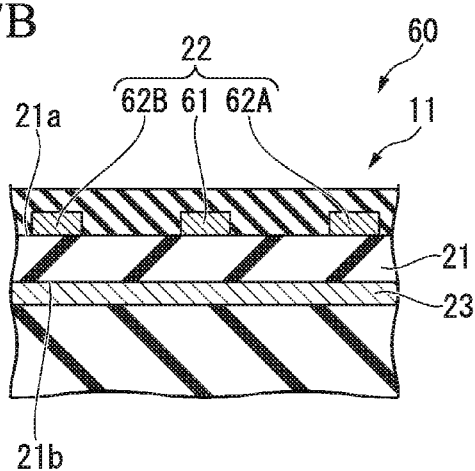
FIG. 7B is a cross-sectional view of the simulation model taken along a line F7B-F7B illustrated in FIG. 7A.
Figure 7C:
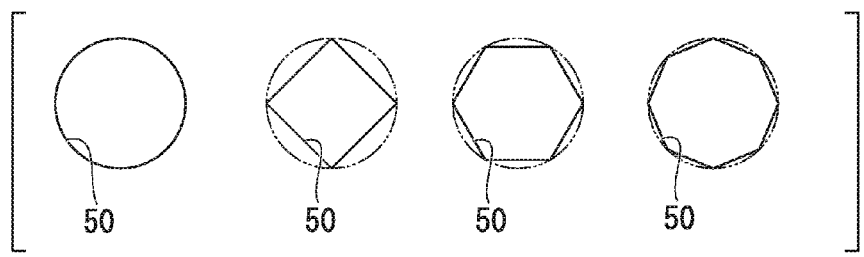
FIG. 7C is a plan view of an opening of the simulation model illustrated in FIG. 7A.

FIGS. 7A to 7C illustrate an example of a simulation model 60 used in three-dimensional magnetic field analysis. FIG. 7A is a plan view of the simulation model 60 according to the first embodiment. FIG. 7B is a cross-sectional view of the simulation model 60 taken along a line F7B-F7B illustrated in FIG. 7A. FIG. 7C illustrates an example of some of opening shapes of the openings 50 of the ground layer 23 in the simulation model 60.

As illustrated in FIG. 7A, a signal layer 22 of the simulation model 60 includes a signal line 61 serving as an analysis target of the electrical characteristic and a pair of signal lines 62A and 62B arranged on both sides of the signal line 61. The pair of the signal lines 62A and 62B extend substantially parallel to the signal line 61, which is an analysis target. The pair of the signal lines 62A and 62B are included in the simulation model 60, since the pair of the signal lines 62A and 62B give a large influence on the electrical characteristic of the signal line 61. The signal lines 61, 62A, and 62B correspond to any one set of signal lines included in the above-described signal lines 31, 32, 33, and 34.

As illustrated in FIG. 7B, the simulation model 60 includes the signal lines 61, 62A, and 62B, the insulator layer 21, and the ground layer 23 in the thickness direction of the board 11. The signal lines 61, 62A, and 62B are on the first surface 21a of the insulator layer 21. The ground layer 23 is on the second surface 21b of the insulator layer 21. The ground layer 23 has the plurality of openings 50 as illustrated in FIG. 2.

As illustrated in FIG. 7C, a simulation is performed for each of a plurality of opening shapes in the present simulation. The opening shapes to be used in the simulation are circles, squares, regular hexagons, regular octagons, or the like. The opening shapes are not limited to the above-described examples. As illustrated in FIG. 7C, a size of each regular polygon of the openings 50 is a size inscribed inside a circle which is one of opening shapes of the openings 50.

Figure 8:
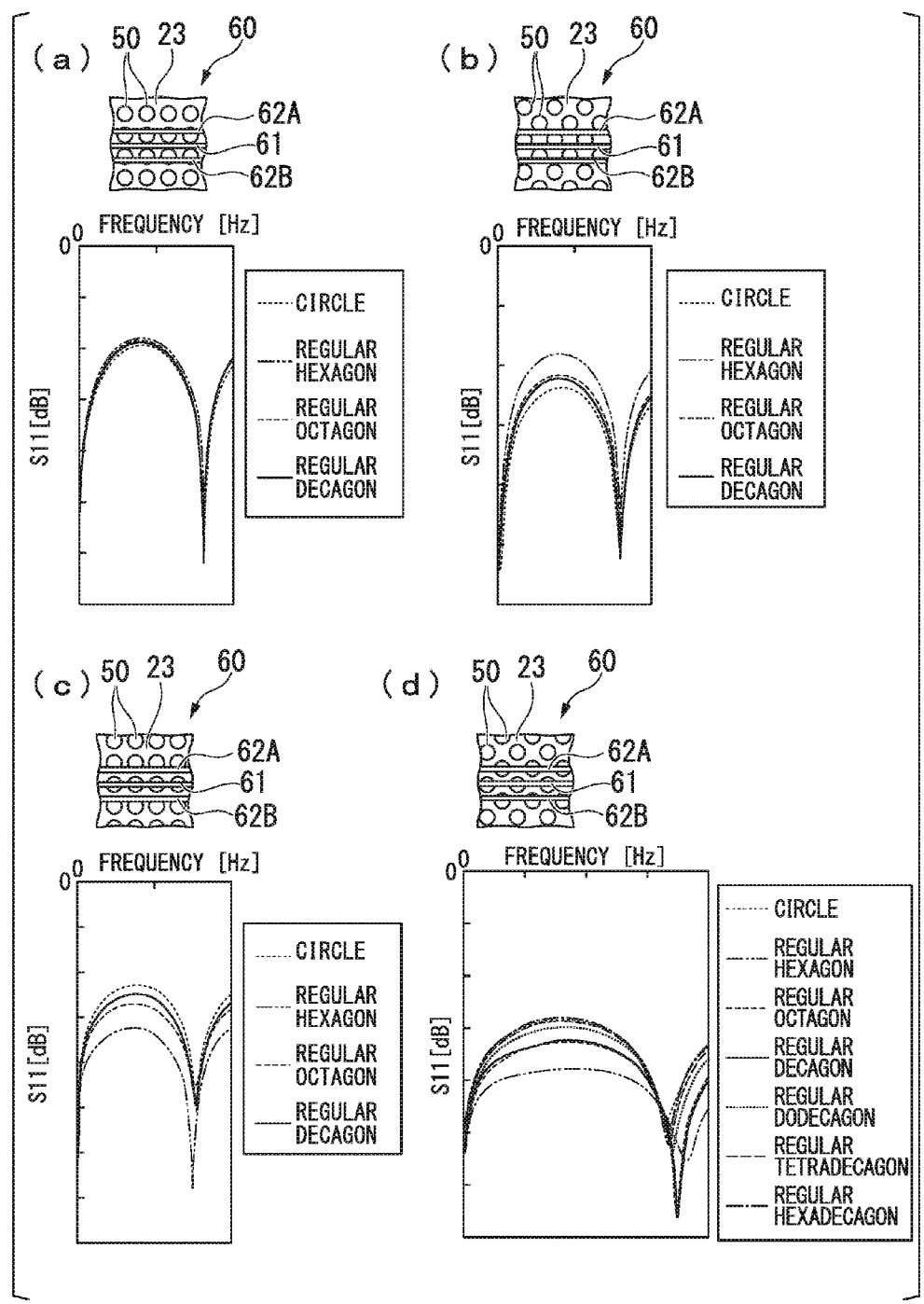
FIG. 8, 9, 10A, 10B, 11A, and 11B each illustrate an analysis result of a simulation according to the first embodiment.

FIG. 8 illustrates an analysis result of performing a simulation by a finite element method using the simulation model 60 illustrated in FIG. 7A. FIG. 8 illustrates a variation of a reflection characteristic S11 of a signal line 61 depending on opening shapes of the plurality of openings 50. In the drawing of the simulation model 60 illustrated in (a), (b), (c), and (d) of FIG. 8, the case in which the opening shape is a circle is representatively illustrated.

For example, (a) of FIG. 8 illustrates a model which has a 90-degree arrangement pattern and in which the signal line 61 is provided between the plurality of openings 50 when viewed in Z direction.

For example, (b) of FIG. 8 illustrates a model in which an arrangement of openings 50 of the ground layer 23 is tilted by an angle of 45 degrees with respect to the model of (a) of FIG. 8. In other words, the model of (b) of FIG. 8 is a model in which an extension direction of the signal line 61 with respect to the ground layer 23 is different by 45 degrees from the model of (a) of FIG. 8. In the model of (b) of FIG. 8, the signal line 61 is provided between the plurality of openings 50 when viewed in Z direction.

For example, (c) of FIG. 8 illustrates a model having the same arrangement of the openings 50 of the ground layer 23 as the model of (a) of FIG. 8. However, (c) of FIG. 8 illustrates the model in which the signal line 61 overlaps the openings 50 of the ground layer 23 when viewed in Z direction.

For example, (d) of FIG. 8 illustrates a model in which an arrangement of openings 50 of the ground layer 23 is tilted by an angle of 45 degrees with respect to the model of (d) of FIG. 8. In other words, the model of (d) of FIG. 8 is a model in which an extension direction of the signal line 61 with respect to the ground layer 23 is different by 45 degrees from the model of (c) of FIG. 8. (d) of FIG. 8 illustrates the model in which the signal line 61 overlaps the openings 50 of the ground layer 23 when viewed in Z direction.

As illustrated in (a) to (d) of FIG. 8, it can be seen that the transmission characteristic (reflection characteristic S11) of the regular polygons is closer to the transmission characteristic (reflection characteristic S11) of the circles when the numbers of corners 51 of the openings 50 are larger.

Figure 9:
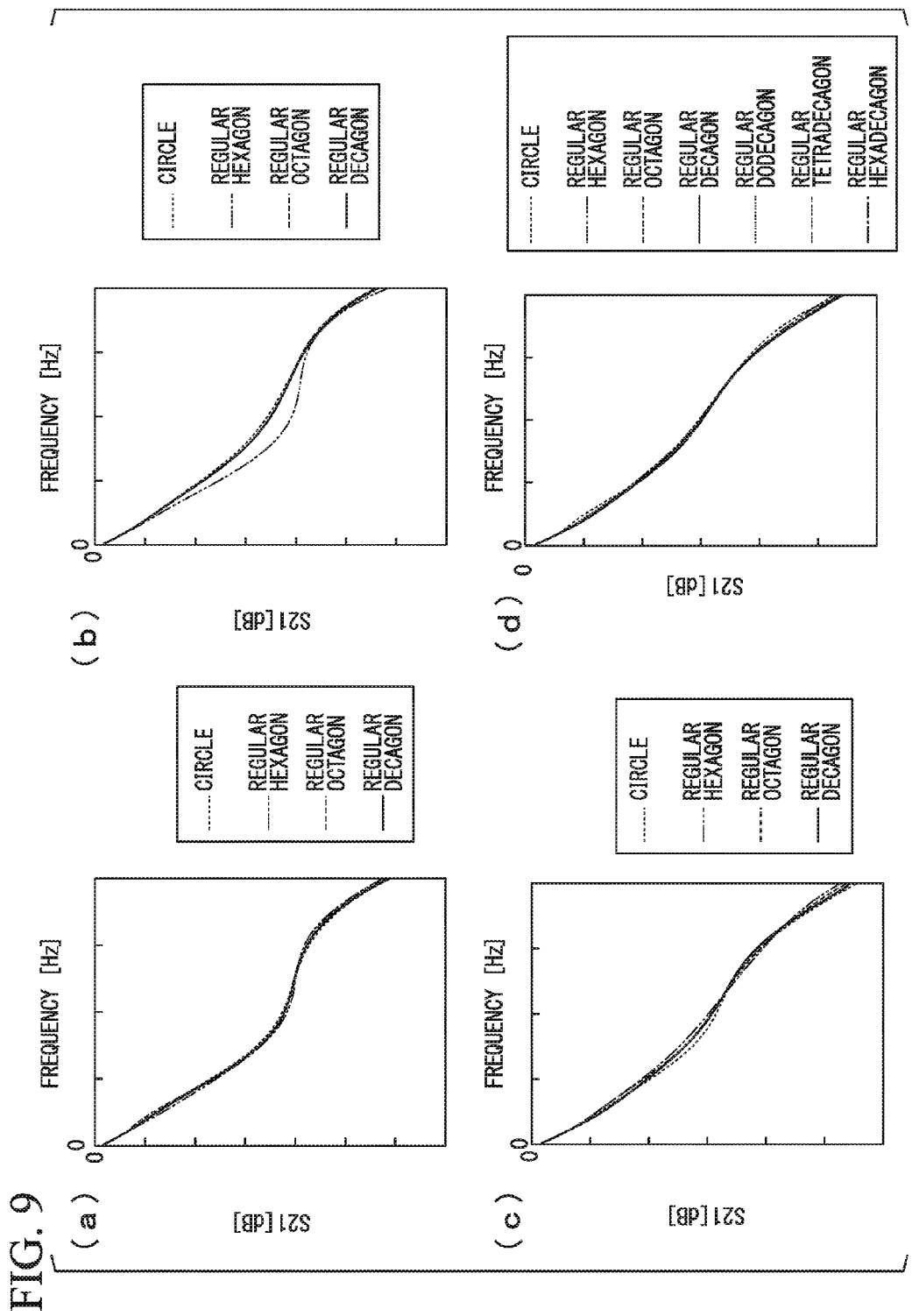

FIG. 9 illustrates analysis results of performing a simulation by a finite element method using the simulation model 60 illustrated in FIG. 7A. FIG. 9 illustrates a change of a passage characteristic S21 of the signal line 61 depending on opening shapes of the plurality of openings 50. Also, in the drawing of the simulation model 60 illustrated in (a), (b), (c), and (d) of FIG. 8, the case in which the opening shapes are circles is representatively illustrated.

The model of (a) of FIG. 9 is the same as the model of (a) of FIG. 8. The model of (b) of FIG. 9 is the same as the model of (b) of FIG. 8. The model of (c) of FIG. 9 is the same as the model of (c) of FIG. 8. The model of (d) of FIG. 9 is the same as the model of (d) of FIG. 8. As illustrated in FIG. 9, the transmission characteristic (passage characteristic S21) of the regular polygons is closer to the transmission characteristic (passage characteristic S21) of the circles when the numbers of corners 51 of the openings 50 are larger.

Figure 10A:
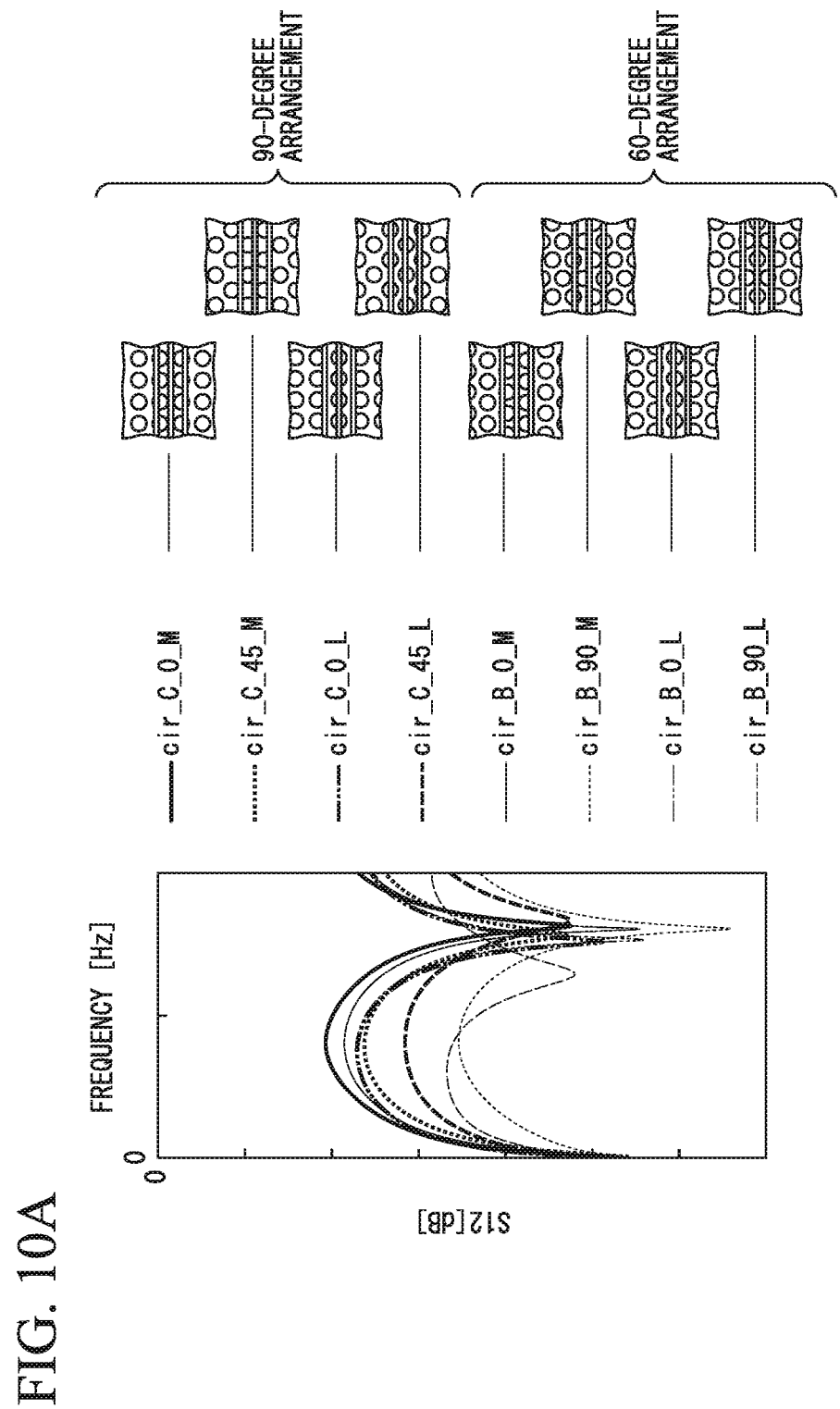
Figure 10B:
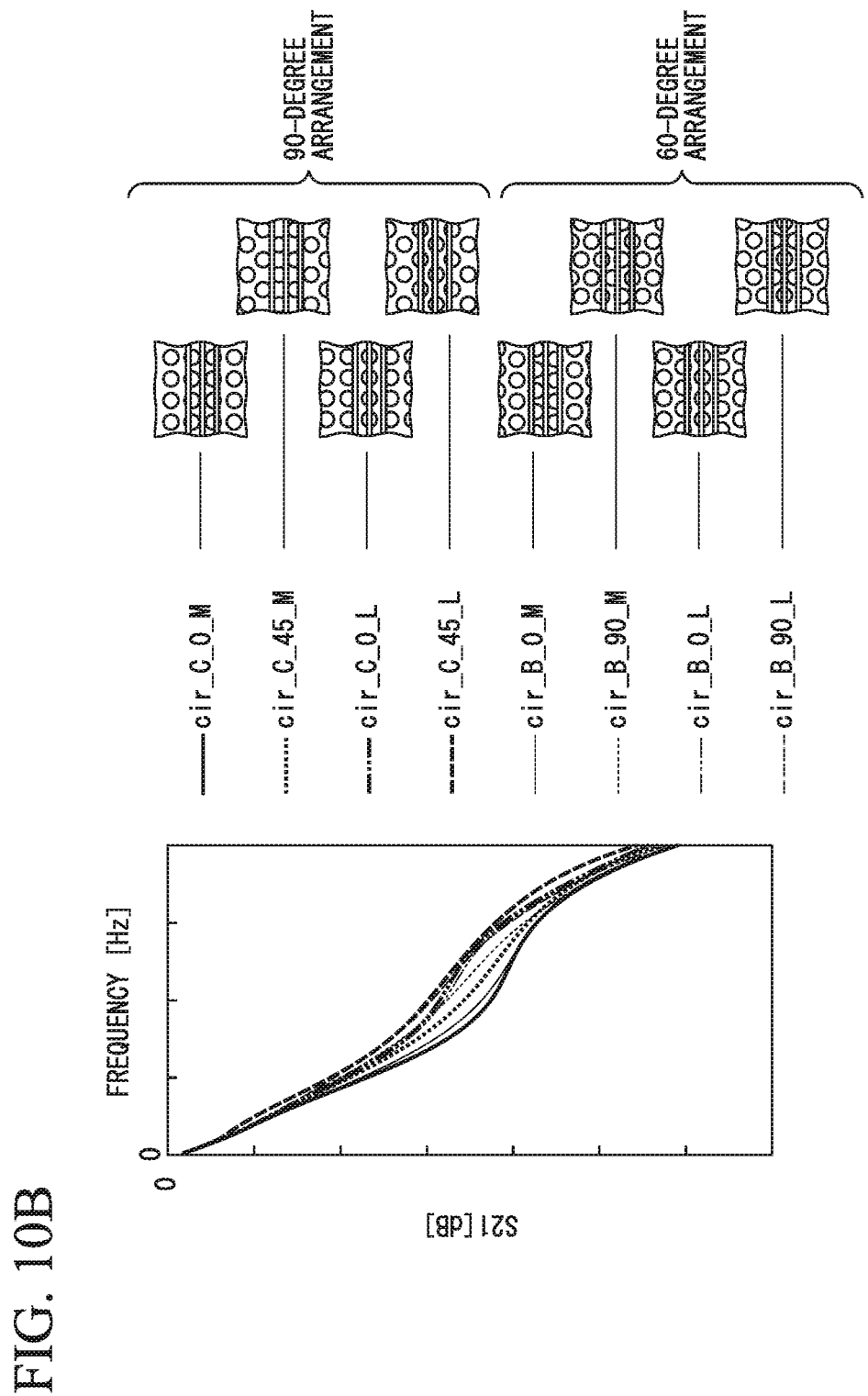

FIGS. 10A and 10B illustrate other analysis results of performing a simulation by the finite element method using the simulation model 60 illustrated in FIG. 7A. FIG. 10A illustrates a difference in the reflection characteristic S11 of the signal line 61 in the case of the 90-degree arrangement pattern and the case of the 60-degree arrangement pattern. FIG. 10B illustrates a difference in the passage characteristic S21 of the signal line 61 in the case of the 90-degree arrangement pattern and the case of the 60-degree arrangement pattern. In the simulation, the circles were used as opening shapes for simplification of the model. Also, "C" in FIGS. 10A and 10B indicates a model in which circular openings 50 are arranged in the 90-degree arrangement pattern. "B" in FIGS. 10A and 10B indicates a model in which circular openings 50 are arranged in the 60-degree arrangement pattern. "M" in FIGS. 10A and 10B indicates a model in which the signal lines 61 are provided between the plurality of openings 50 when viewed in Z direction. "L" in FIGS. 10A and 10B indicates a model in which the signal line 61 overlaps the openings 50 when viewed in Z direction.

As illustrated in FIG. 10A, the transmission characteristic (reflection characteristic S11) of the case of the 60-degree arrangement pattern is better than the transmission characteristic of the 90-degree arrangement pattern (a maximum value of S11 is small). Also, as illustrated in FIG. 10B, the transmission characteristic (passage characteristic S21) of the case of the 60-degree arrangement pattern is better than the transmission characteristic (passage characteristic S21) of the 90-degree arrangement pattern (a minimum value of S21 is large). Also, as described above, it can be seen that the transmission characteristic when the openings 50 are regular polygons is more similar to the transmission characteristic when the openings 50 are circles if the numbers of corners 51 of the openings 50 are larger. Thus, even when the openings 50 are the regular polygons, it can be said that the transmission characteristic of the case of the 60-degree arrangement pattern is better than the transmission characteristic of the case of the 90-degree arrangement pattern.

Figure 11A:
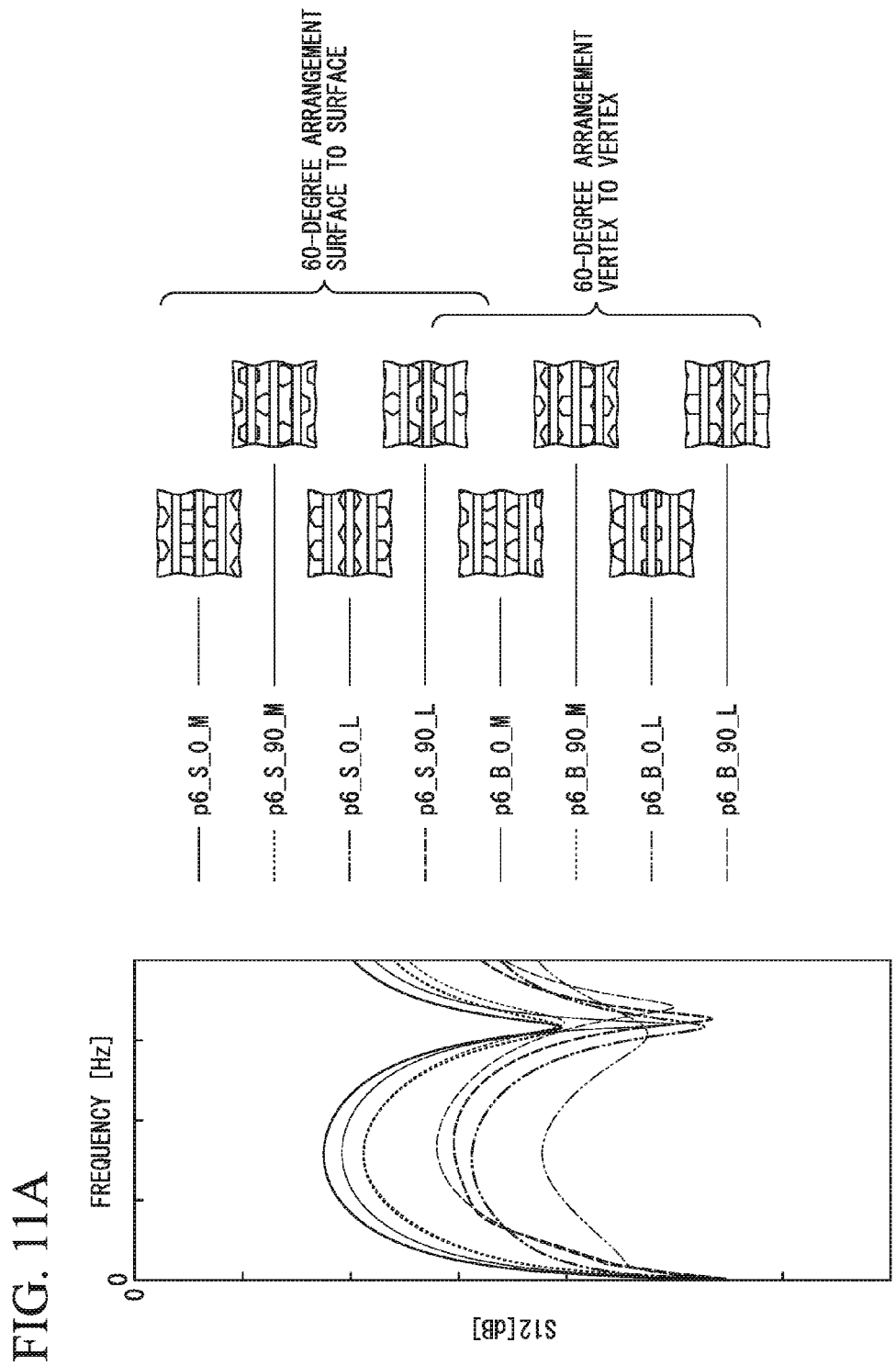
Figure 11B:
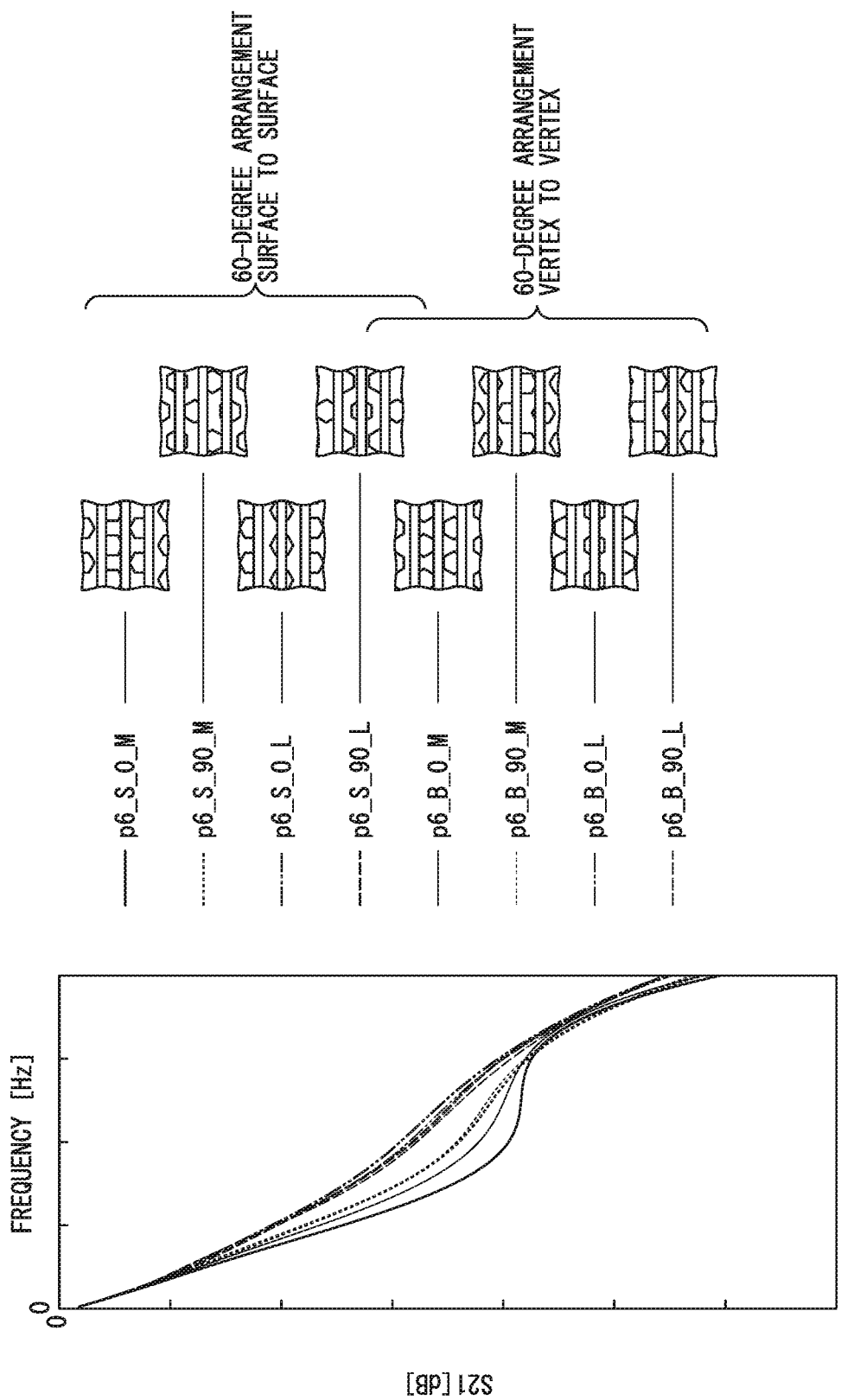

FIGS. 11A and 11B illustrate other analysis results of performing a simulation by the finite element method using the simulation model 60 illustrated in FIG. 7A. FIG. 11A illustrates a difference of the reflection characteristic S11 of the signal line 61 when an arrangement scheme of a plurality of openings 50 is different. FIG. 11B illustrates a difference of the passage characteristic S21 of the signal line 61 when an arrangement scheme of a plurality of openings 50 is different. Also, "p6" in FIGS. 11A and 11B indicates a model in which the openings 50 are regular hexagons. "S" indicates a model in which sides of the plurality of openings 50 are arranged to confront each other (e.g., extend parallel to each other) in the 60-degree arrangement pattern. "B" indicates a model in which vertices (corners 51) of the plurality of openings 50 are arranged to confront each other in the 60-degree arrangement pattern. "M" indicates a model in which the signal line 61 is provided between the plurality of openings 50 when viewed in Z direction. "L" indicates a model in which the signal line 61 overlaps the openings 50 when viewed in Z direction.

As illustrated in FIG. 11A, the transmission characteristic (reflection characteristic S11) when vertices (corners 51) of the plurality of openings 50 are arranged to confront each other is better than the transmission characteristic when sides of the plurality of openings 50 are arranged to confront each other (a maximum value of S11 is small).

As illustrated in FIG. 11B, the transmission characteristic (passage characteristic S21) when vertices (corners 51) of the plurality of openings 50 are arranged to confront each other is better than the transmission characteristic when sides of the plurality of openings 50 are arranged to confront each other (a minimum value of S21 is large).

Next, a method of designing the board 11 according to the present embodiment will be described.

Figure 12:
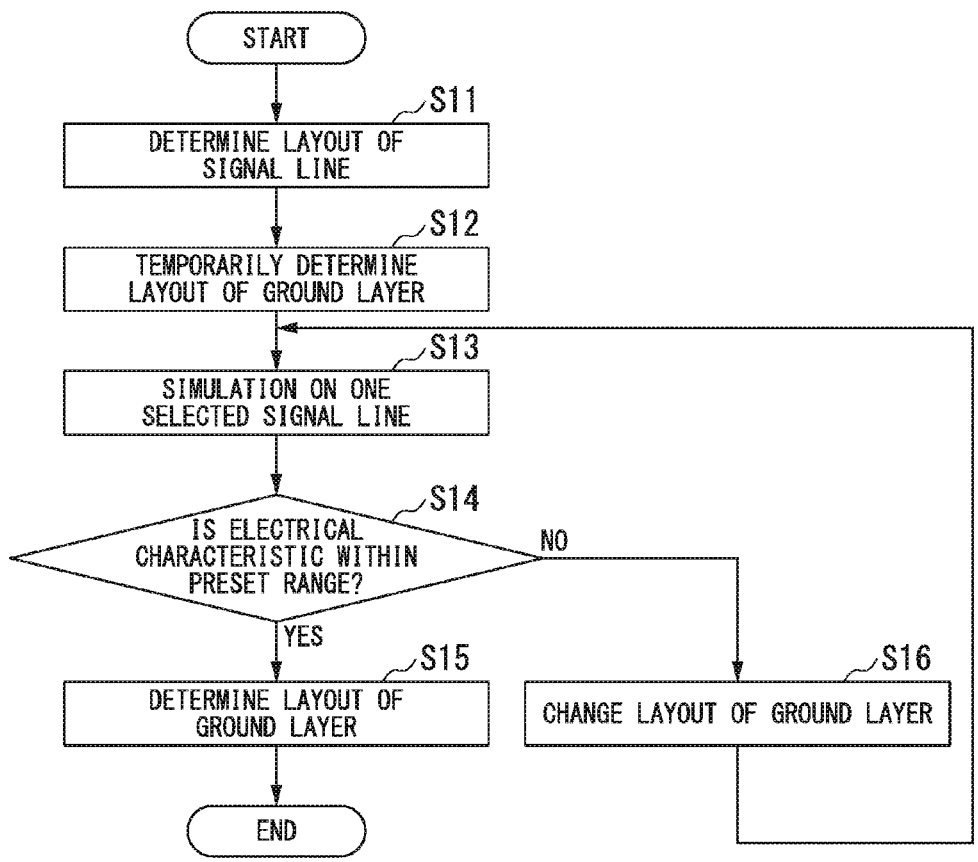
FIG. 12 is a flowchart illustrating a flow of a method of designing the board according to the first embodiment.

FIG. 12 is a flowchart illustrating an example of a flow of the method of designing the board 11.

As illustrated in FIG. 12, first, the layouts of the plurality of signal lines 31, 32, 33, and 34 are determined (S11).

Next, the layout of the ground layer 23 is temporarily determined (S12). The layout of the ground layer 23 includes the number of openings 50, sizes, shapes, and positions of the openings 50, etc. Also, the order of the process of S11 and the process of S12 may be reversed.

Next, one signal line is optionally selected from the plurality of signal lines 31, 32, 33, and 34. The electrical characteristic (e.g., the transmission characteristic) of the one selected signal line is analyzed by a simulation (e.g., a simulation by the finite element method) (S13). Then, it is determined whether the electrical characteristic (e.g., the transmission characteristic) of the above-described signal line obtained by the analysis of the simulation is within a preset desired range (S14).

Here, in the present embodiment, the plurality of openings 50 is arranged to be substantially uniformly discrete. Also, the plurality of openings 50 is regular polygons each including at least five corners. Thus, even when positions or extension directions of the plurality of signal lines 31, 32, 33, and 34 for the plurality of openings 50 are different from each other, variation in the electrical characteristics (e.g., the transmission characteristics) of the plurality of signal lines 31, 32, 33, and 34 does not easily occur. Thus, when the electrical characteristic of the one selected signal line is within a preset range, the electrical characteristics of other signal lines can also be regarded to be within substantially the same range.

Thus, when the electrical characteristic of the above-described signal line obtained by the analysis of a simulation is within the preset range (S14: YES), the layout of the ground layer 23 is formally determined to be a temporarily determined layout.

On the other hand, when the electrical characteristic of the above-described signal line obtained by the analysis of a simulation is not within the preset range (S14: NO), the layout of the ground layer 23 is changed (S16). The change of the layout of the ground layer 23 indicates, for example, at least any one change of the number of openings 50, the sizes, the shapes, and the positions of the openings 50, etc. The processes of S13 and S14 are re-performed on the changed layout of the ground layer 23.

Also, the method of designing the above-described board 11 is also applicable to the second and third embodiments described below.

According to the configuration described above, reliability of the board 11 can be improved and the design of the board 11 can become more flexible.

For example, when the board 11 is relatively thin, characteristic impedance of the signal line may be less than a desired value. In this case, the plurality of openings 50 is provided in the ground layer 23, thereby increasing the characteristic impedance of the signal line. Thereby, the characteristic impedance of the signal line can be close to the desired value.

Here, when the openings 50 are formed as squares, a variation in a degree of overlap (e.g., an overlap area) between the ground layer 23 and the signal line 31 due to a position or a direction of the signal line 31 with respect to the openings 50 is likely to occur. For example, when the signal line 31 crosses the openings 50 in a direction substantially parallel to one side of the square openings 50 and when the signal line 31 diagonally crosses the side of the square openings 50, a degree of overlap between the ground layer 23 and the signal line 31 is relatively significantly different. Thus, the characteristic impedance of the signal line 31 is likely to be varied by a position or a direction of the signal line 31 with respect to the openings 50.

On the other hand, in the present embodiment, each of the plurality of openings 50 is formed as a regular polygon having five or more corners 51. According to this configuration, a variation in a degree of overlap between the ground layer 23 and the signal line 31 can be reduced due to a position or a direction of the signal line 31 with respect to the openings 50. For example, a variation in the degree of overlap between the ground layer 23 and the signal line 31 in a plurality of parts (e.g., a first part 41 and a second part 42) of the signal line 31 can be reduced. Thus, the design of impedance of the board 11 (e.g., the design of the characteristic impedance of the signal line 31) can become more flexible.

Also, when each of the plurality of openings 50 is formed as a regular polygon having five or more corners 51, a variation in a degree of overlap between each of the plurality of signal lines 31, 32, 33, and 34 and the ground layer 23 can be reduced. Even from this viewpoint, the impedance design of the board 11 (the design of the characteristic impedances of the signal lines 31, 32, 33, and 34) can become more flexible.

For example, when the design of the characteristic impedances of the plurality of signal lines 31, 32, 33, and 34 can become more flexible, the characteristic impedances of the plurality of signal lines 31, 32, 33, and 34 are likely to be aligned to be substantially the same as one another. When the characteristic impedances of the plurality of signal lines 31, 32, 33, and 34 are likely to be aligned to be substantially the same as one another, the transmission characteristic of the differential signal can be improved.

Also, when each of the plurality of openings 50 is a regular polygon, a simulation model (e.g., a mesh element in the finite element method) can be simplified more than when the openings 50 are circles. Thus, an analysis time (e.g., a convergence time) of the simulation can be shortened. Thereby, the design of the board 11 can become further flexible.

Figure 13:
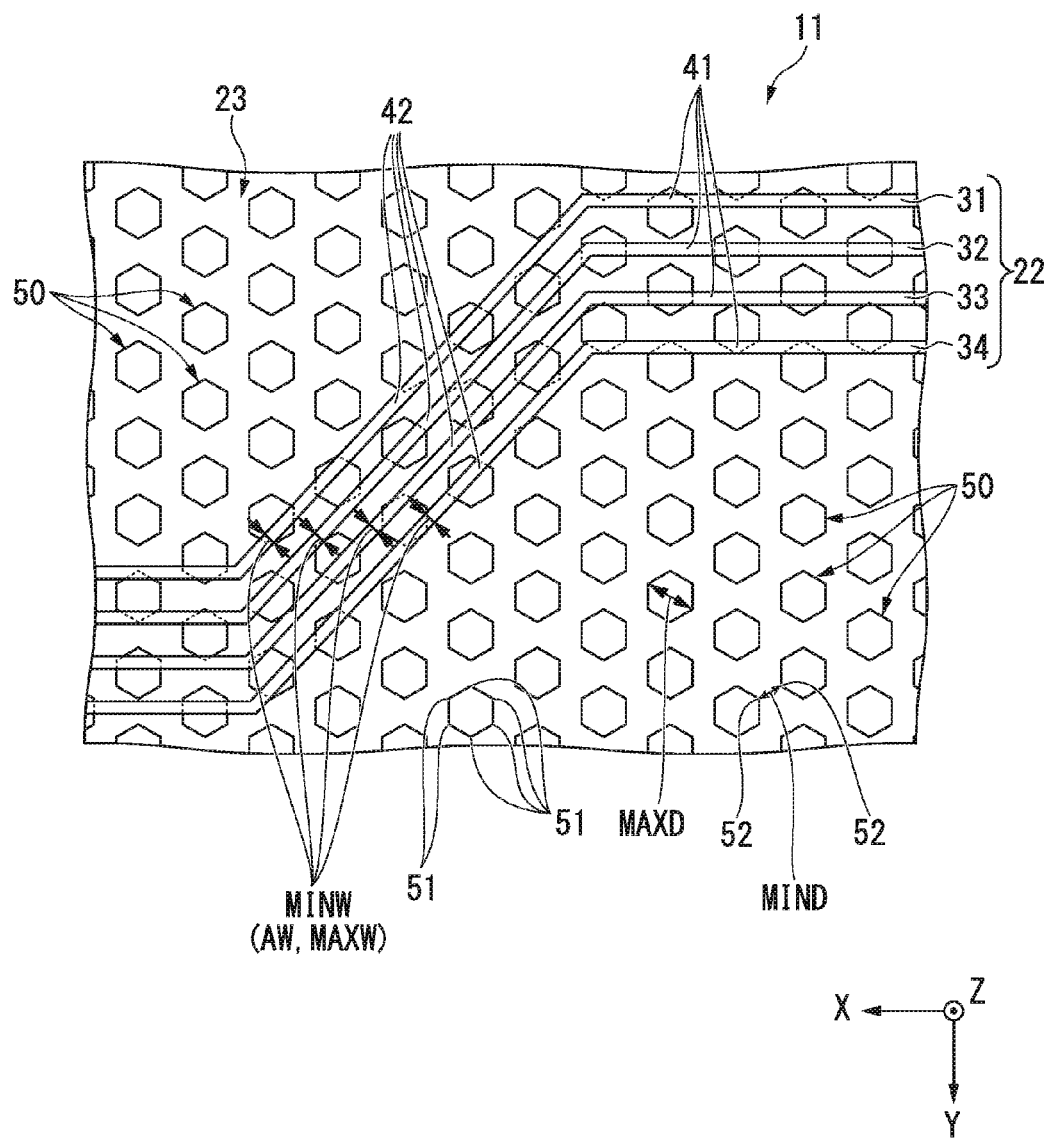
FIG. 13 is a plan view of a board according to a modified example of the first embodiment.

Also, the arrangement of the openings 50 of the ground layer 23 is not limited to the above-described example. For example, as illustrated in FIG. 13, the plurality of openings 50 may be arranged so that corners 51 of the polygon (e.g., a regular hexagon) confront each other.

Second Embodiment

Next, a second embodiment will be described.

The second embodiment is different from the first embodiment in that opening shapes of a ground layer 23 are regular octagons. Also, the other configurations are similar to those of the first embodiment. Thus, redundant description thereof will be omitted. Also, in the drawings shown in the following, the illustration of an insulator layer 21 will be omitted and the layouts of a plurality of signal lines 31, 32, 33, and 34 and the ground layer 23 are shown.

Figure 14:
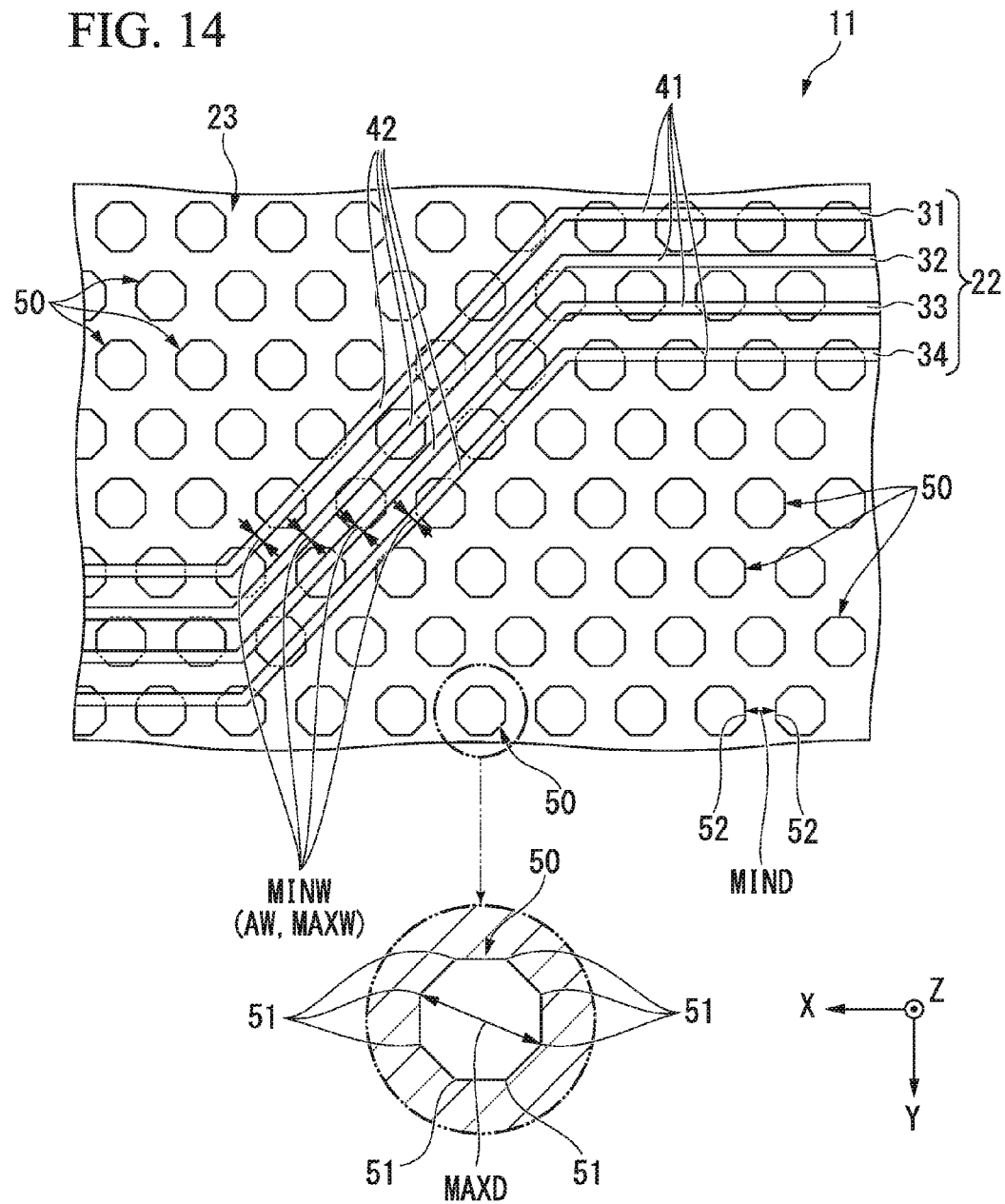
FIG. 14 is a plan view of a board according to a second embodiment.

FIG. 14 is a plan view of a board 11 according to the second embodiment.

As illustrated in FIG. 14, each of a plurality of openings 50 of the present embodiment has at least seven or more corners 51. For example, each of the plurality of openings includes at least eight or more corners 51. In the present embodiment, each of the plurality of openings 50 is formed as a regular polygon. In the present embodiment, each of the plurality of openings 50 is formed as a regular octagon. In the present embodiment, the plurality of openings 50 has the same shape as one another. In the present embodiment, the plurality of openings 50 has substantially the same size as one another.

As illustrated in FIG. 14, the plurality of openings 50 is arranged at intervals substantially equal to one another. They are arranged to be substantially uniformly discrete throughout the ground layer 23. Some openings 50 included in the plurality of openings 50 overlap a first part 41 of any one of the first to fourth signal lines 31, 32, 33, and 34 when viewed in Z direction (e.g., when seen through in Z direction). Also, other openings 50 included in the plurality of openings 50 overlap a second part 42 of any one of the first to fourth signal lines 31, 32, 33, and 34 when viewed in Z direction.

For example, each of the first to fourth signal lines 31, 32, 33, and 34 overlaps at least one corner 51 included in the above-described regular octagon in at least one of the plurality of openings 50 when viewed in Z direction. In the present embodiment, each of the first to fourth signal lines 31, 32, 33, and 34 overlaps at least two corners 51 included in the above-described regular octagon in at least one of the plurality of openings 50 when viewed in Z direction. From another viewpoint, in the present embodiment, each of the first to fourth signal lines 31, 32, 33, and 34 overlaps at least one corner 51 included in the above-described regular octagons in at least two of the plurality of openings 50 when viewed in Z direction.

According to this configuration, reliability of the board 11 can be improved and the design of the board 11 can become further flexible.

In the present embodiment, each of the plurality of openings 50 is formed as a regular polygon including seven or more corners 51. According to this configuration, a variation in a degree of overlap between the ground layer 23 and the signal line 31 can be further reduced due to a position or a direction of the signal line 31 with respect to the openings 50. For example, a variation in a degree of overlap between the ground layer 23 and the signal line 31 in a plurality of parts (e.g., a first part 41 and a second part 42) of the signal line 31 can be further reduced. Thus, the design of impedance of the board 11 (e.g., the design of the characteristic impedance of the signal line 31) can become further flexible.

Also, when each of the plurality of openings 50 is formed as a regular polygon including seven or more corners 51, a variation in a degree of overlap between each of the plurality of signal lines 31, 32, 33, and 34 and the ground layer 23 can be further reduced. Even from this viewpoint, the impedance design of the board 11 (the design of the characteristic impedances of the signal lines 31, 32, 33, and 34) can become further flexible.

Figure 15:
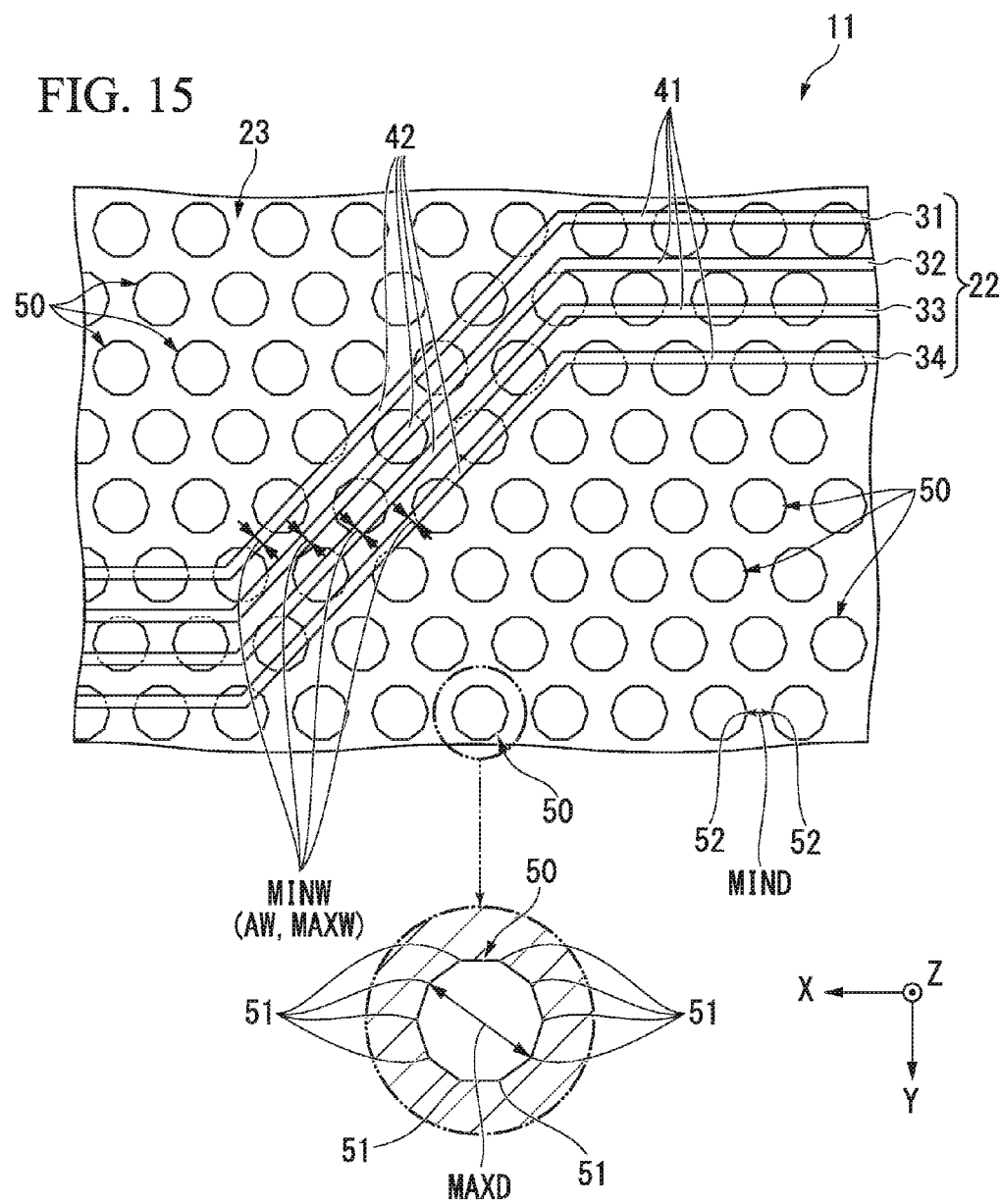
FIG. 15 is a plan view of a board according to a first modified example of the second embodiment.
Figure 16:
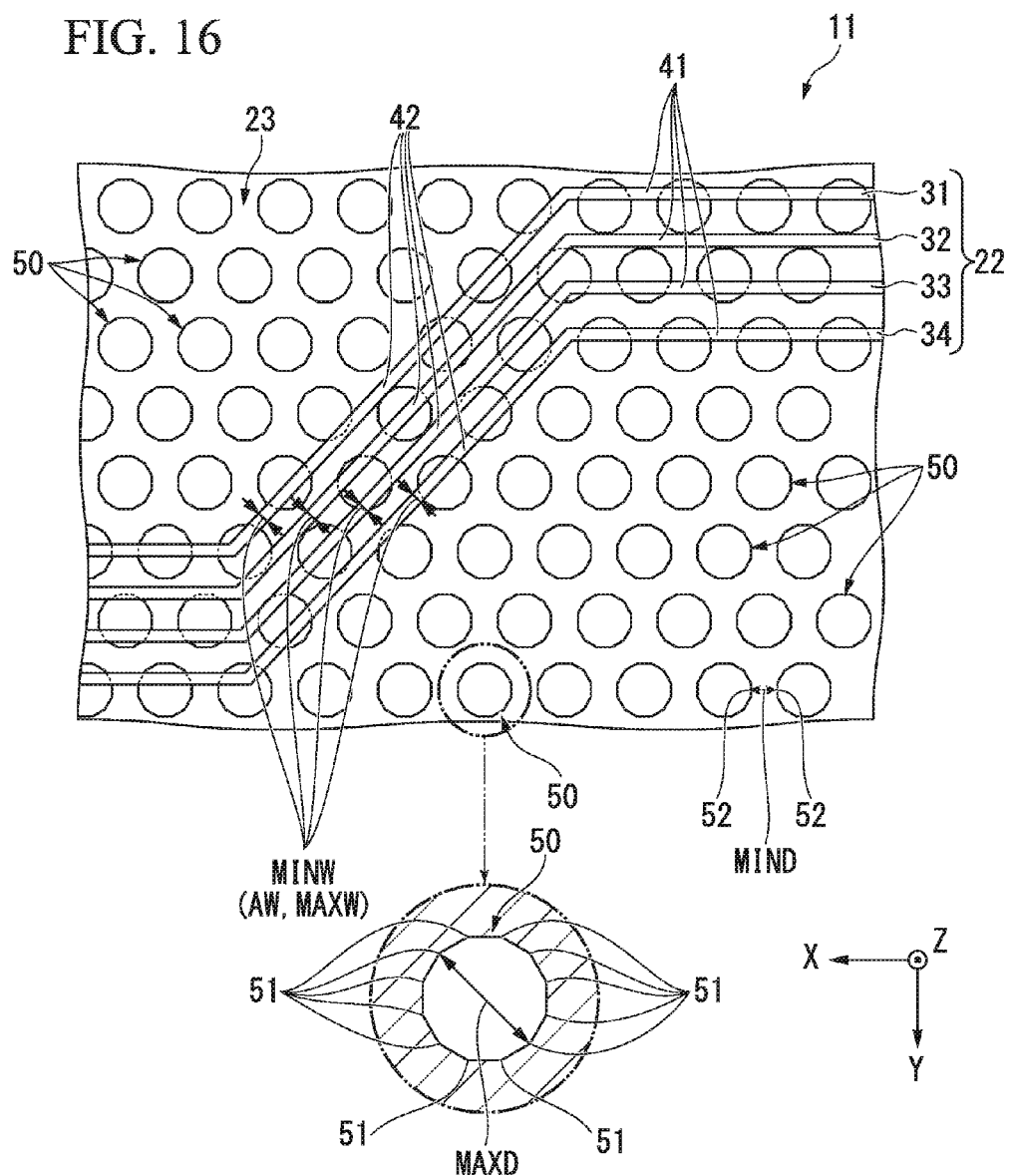
FIG. 16 is a plan view of a board according to a second modified example of the second embodiment.
Figure 17:
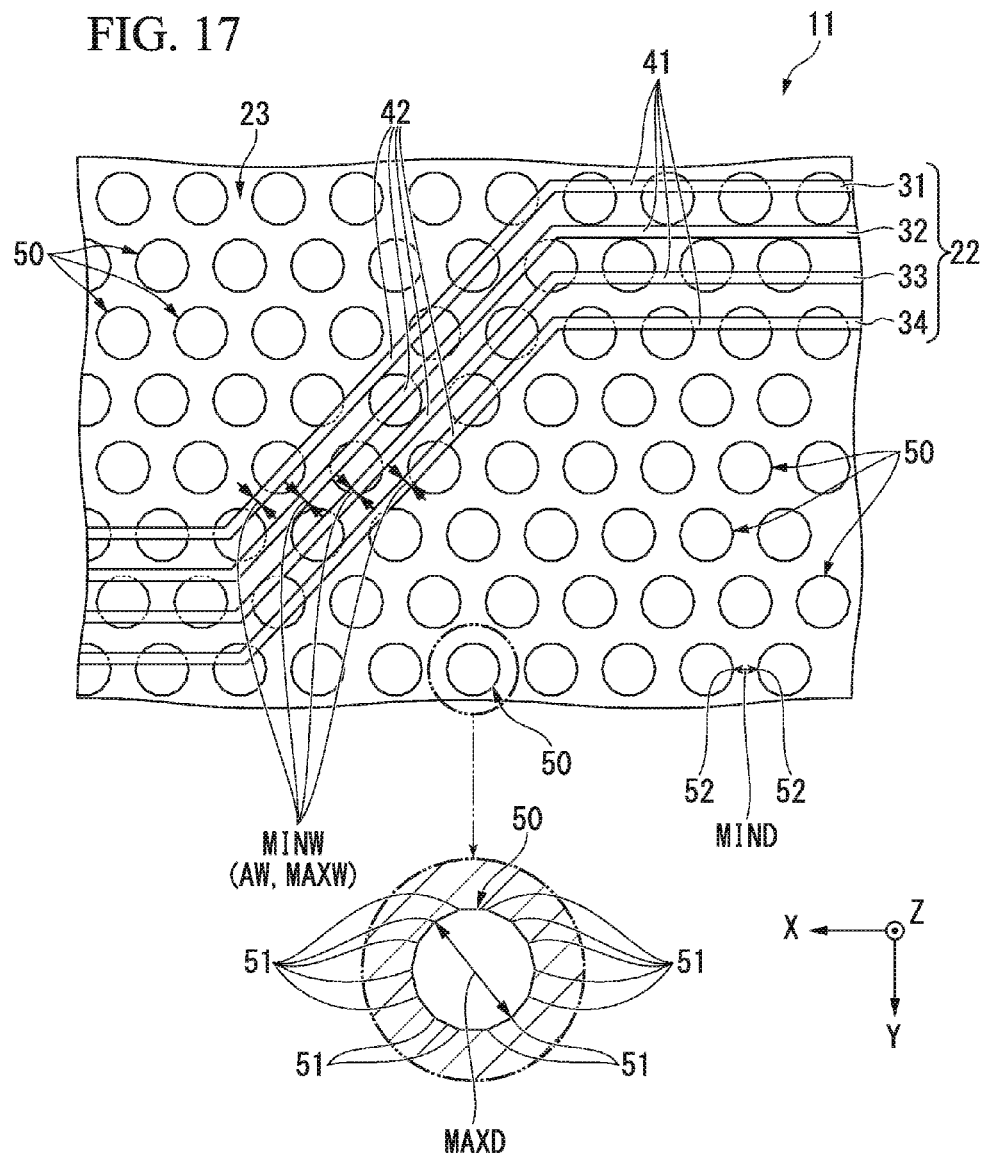
FIG. 17 is a plan view of a board according to a third modified example of the second embodiment.

Also, the shapes of the openings 50 of the ground layer 23 are not limited to the above-described example. For example, each of the plurality of openings 50 may be formed as a regular decagon (see FIG. 15), a regular dodecagon (see FIG. 16), a regular tetradecagon (see FIG. 17), a regular hexadecagon, or another regular polygon (e.g., a polygon including an odd number of corners 51).

Third Embodiment

Next, a third embodiment will be described.

The third embodiment is different from the first embodiment in that opening shapes of a ground layer 23 include curves. Also, the other configurations are similar to those of the first embodiment. Thus, redundant description thereof will be omitted. Also, in the drawings shown below, the illustration of an insulator layer 21 is omitted and the layouts of a plurality of signal lines 31, 32, 33, and 34 and the ground layer 23 are shown.

Figure 18:
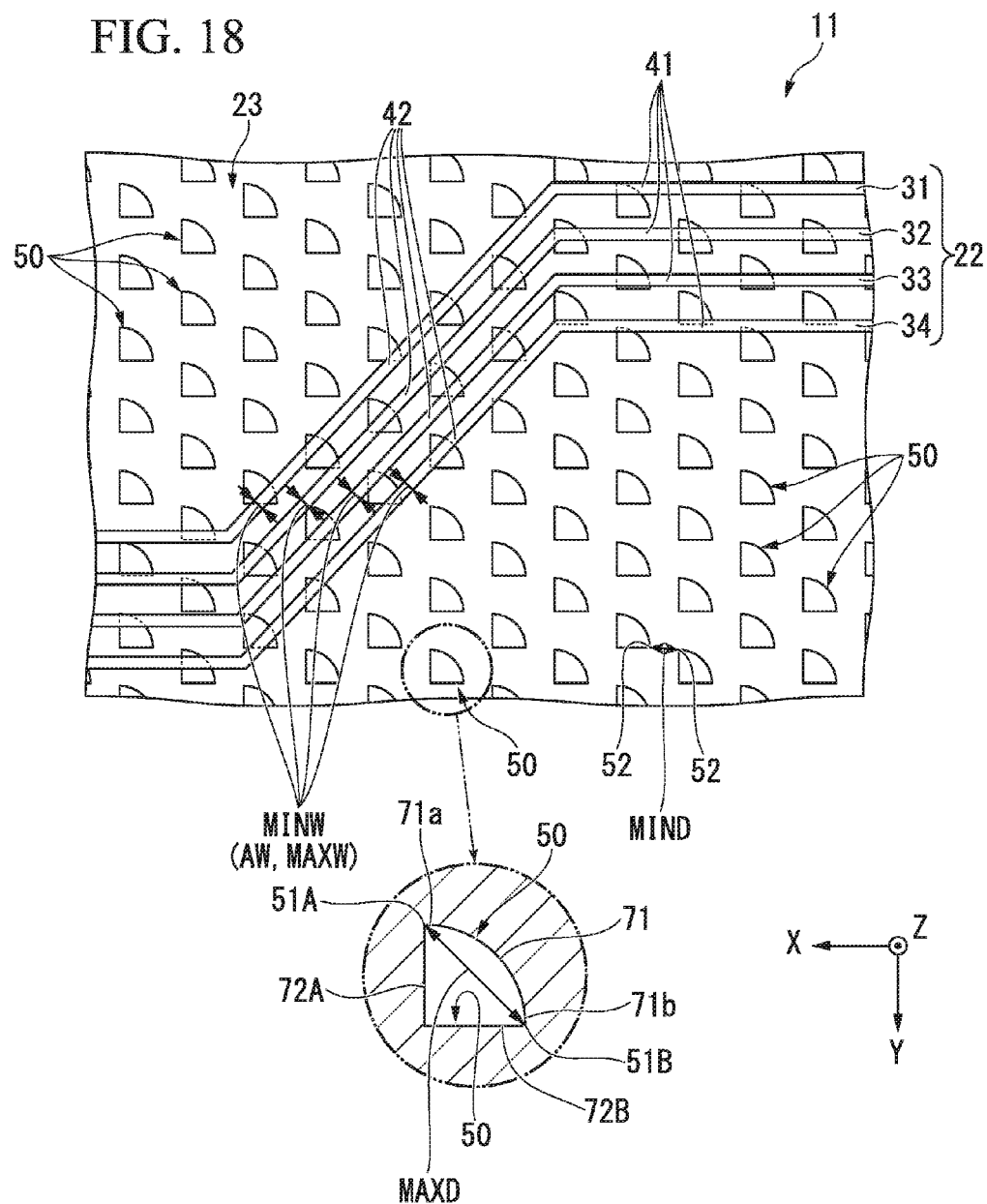
FIG. 18 is a plan view of a board according to a third embodiment.

FIG. 18 is a plan view of a board 11 according to the third embodiment.

As illustrated in FIG. 18, each of a plurality of openings 50 of the ground layer 23 of the present embodiment has a curve 71, a first straight line 72A, a first corner 51A, a second straight line 72B, and a second corner 51B.

The curve 71 is formed in an arc shape. The curve 71 has a first end 71a and a second end 71b positioned opposite to the first end 71a.

The first straight line 72A is adjacent to a first end 71a of the curve 71. For example, the first straight line 72A is connected to the first end 71a of the curve 71.

The first corner 51A is formed at an intersection between the curve 71 and the first straight line 72A. When viewed from the inside of one of the openings 50, an angle between the first straight line 72A and the curve 71 is less than 90 degrees at the first corner 51A.

The second straight line 72B is adjacent to a second end 71b of the curve 71. For example, the second straight line 72B is connected to the second end 71b of the curve 71. From another viewpoint, the second straight line 72B is connected to the curve 71 from a side opposite to the first straight line 72A. In the present embodiment, the second straight line 72B is also connected to the first straight line 72A.

The second corner 51B is formed at an intersection between the curve 71 and the second straight line 72B. When viewed from the inside of one of the openings 50, an angle between the second straight line 72B and the curve 71 is less than 90 degrees at the second corner 51B.

In the present embodiment, the plurality of openings 50 has substantially the same size as one another. The plurality of openings 50 is arranged to be uniformly discrete throughout the ground layer 23. Some openings 50 included in the plurality of openings 50 overlap a first part 41 of any one of the first to fourth signal lines 31, 32, 33, and 34 when viewed in Z direction (e.g., when seen through in Z direction). Also, other openings 50 included in the plurality of openings 50 overlap a second part 42 of any one of the first to fourth signal lines 31, 32, 33, and 34 when viewed in Z direction.

For example, each of the first to fourth signal lines 31, 32, 33, and 34 overlaps at least one corner (e.g., a corner 51A or 51B) in at least one of the plurality of openings 50 when viewed in Z direction. For example, in the present embodiment, each of the first to fourth signal lines 31, 32, 33, and 34 overlaps at least one corner (e.g., the corner 51A or 51B) in at least two of the plurality of openings 50 when viewed in Z direction.

According to this configuration, the reliability of the board 11 can be improved and the design of the board 11 can become further flexible.

For example, when each of the plurality of openings 50 has a curve 71 in at least a part, a variation in a degree of overlap between the ground layer 23 and the signal line 31 can be reduced due to a position or a direction of the signal line 31 with respect to the openings 50. Thus, the impedance design of the board 11 (the design of the characteristic impedances of the signal lines 31, 32, 33, and 34) can become further flexible.

For example, when each of the plurality of openings 50 has straight lines (e.g., straight lines 72A and 72B) in at least a part, a simulation model (e.g., a mesh element in the finite element method) can be further simplified. Thus, an analysis time of the simulation can be shortened more than when the openings 50 are circles. Thereby, the design of the board 11 can become further flexible.

Next, some modified examples of the present embodiment will be described. Also, other configurations described below are similar to those of the third embodiment. Thus, redundant description thereof will be omitted.

First Modified Example

Figure 19:
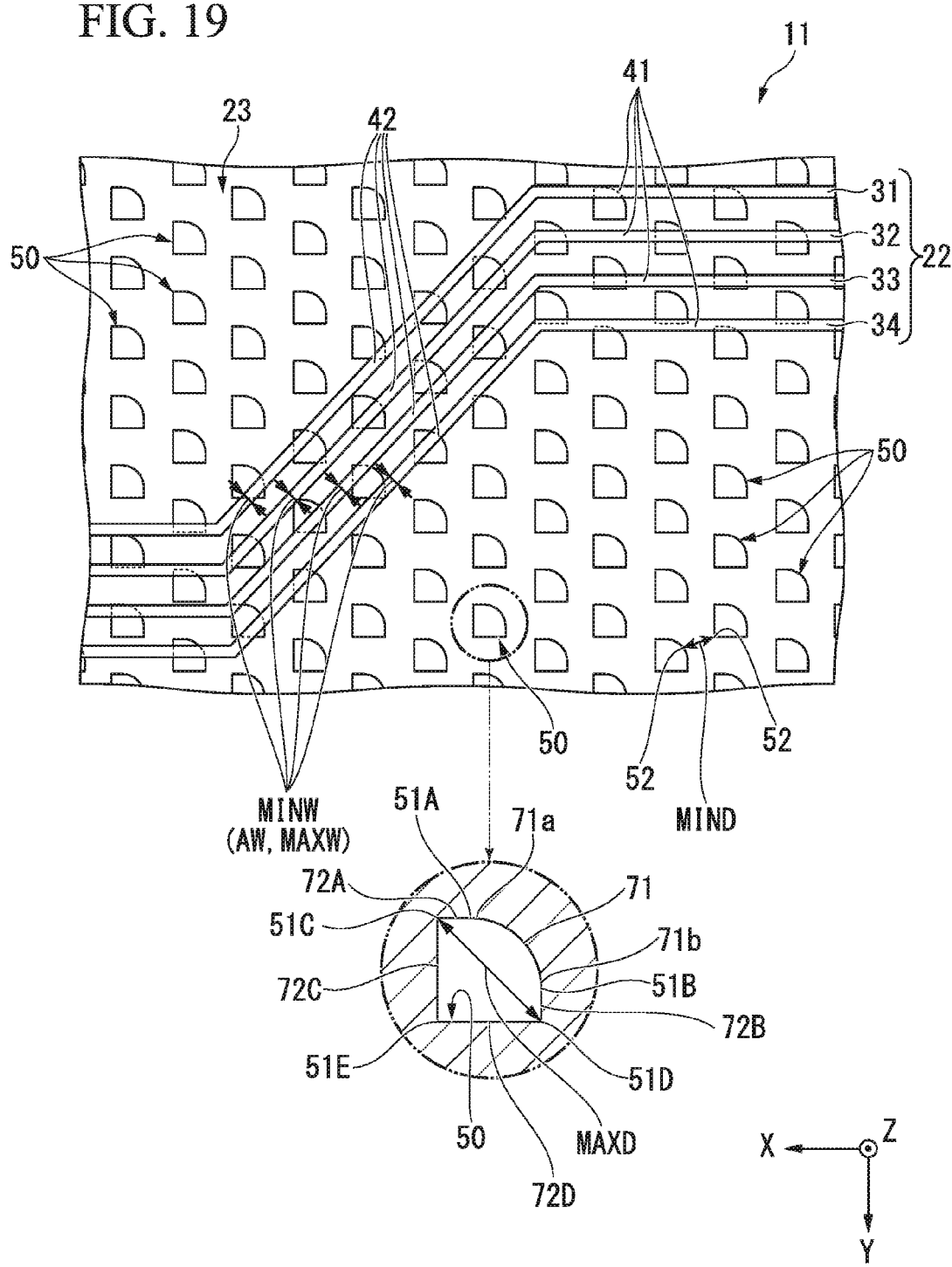
FIG. 19 is a plan view of a board according to a first modified example of the third embodiment.

FIG. 19 illustrates a board 11 according to a first modified example.

Each of a plurality of openings 50 of the present embodiment has a curve 71, a first straight line 72A, a first corner 51A, a second straight line 72B, a second corner 51B, a third straight line 72C, a third corner 51C, a fourth straight line 72D, a fourth corner 51D, and a fifth corner 51E.

The first straight line 72A is adjacent to a first end 71a of the curve 71. For example, the first straight line 72A is connected to the first end 71a of the curve 71. The first corner 51A is formed at an intersection between the curve 71 and the first straight line 72A. When viewed from the inside of one of the openings 50, an angle between the first straight line 72A and the curve 71 is greater than 90 degrees at the first corner 51A.

The second straight line 72B is adjacent to a second end 71b of the curve 71. For example, the second straight line 72B is connected to the second end 71b of the curve 71. The second corner 51B is formed at an intersection between the curve 71 and the second straight line 72B. When viewed from the inside of one of the openings 50, an angle between the second straight line 72B and the curve 71 is greater than 90 degrees at the second corner 51B.

The third straight line 72C is connected to the first straight line 72A. The third corner 51C is formed at an intersection between the first straight line 72A and the third straight line 72C. When viewed from the inside of one of the openings 50, an angle between the first straight line 72A and the third straight line 72C is substantially 90 degrees at the third corner 51C.

The fourth straight line 72D is connected to the second straight line 72B. The fourth corner 51D is formed at an intersection between the second straight line 72B and the fourth straight line 72D. When viewed from the inside of one of the openings 50, an angle between the second straight line 72B and the fourth straight line 72D is about 90 degrees at the fourth corner 51D.

The fifth corner 51E is formed at an intersection between the third straight line 72C and the fourth straight line 72D. When viewed from the inside of one of the openings 50, an angle between the third straight line 72C and the fourth straight line 72D is substantially 90 degrees at the fifth corner 51E.

Second Modified Example

Figure 20:
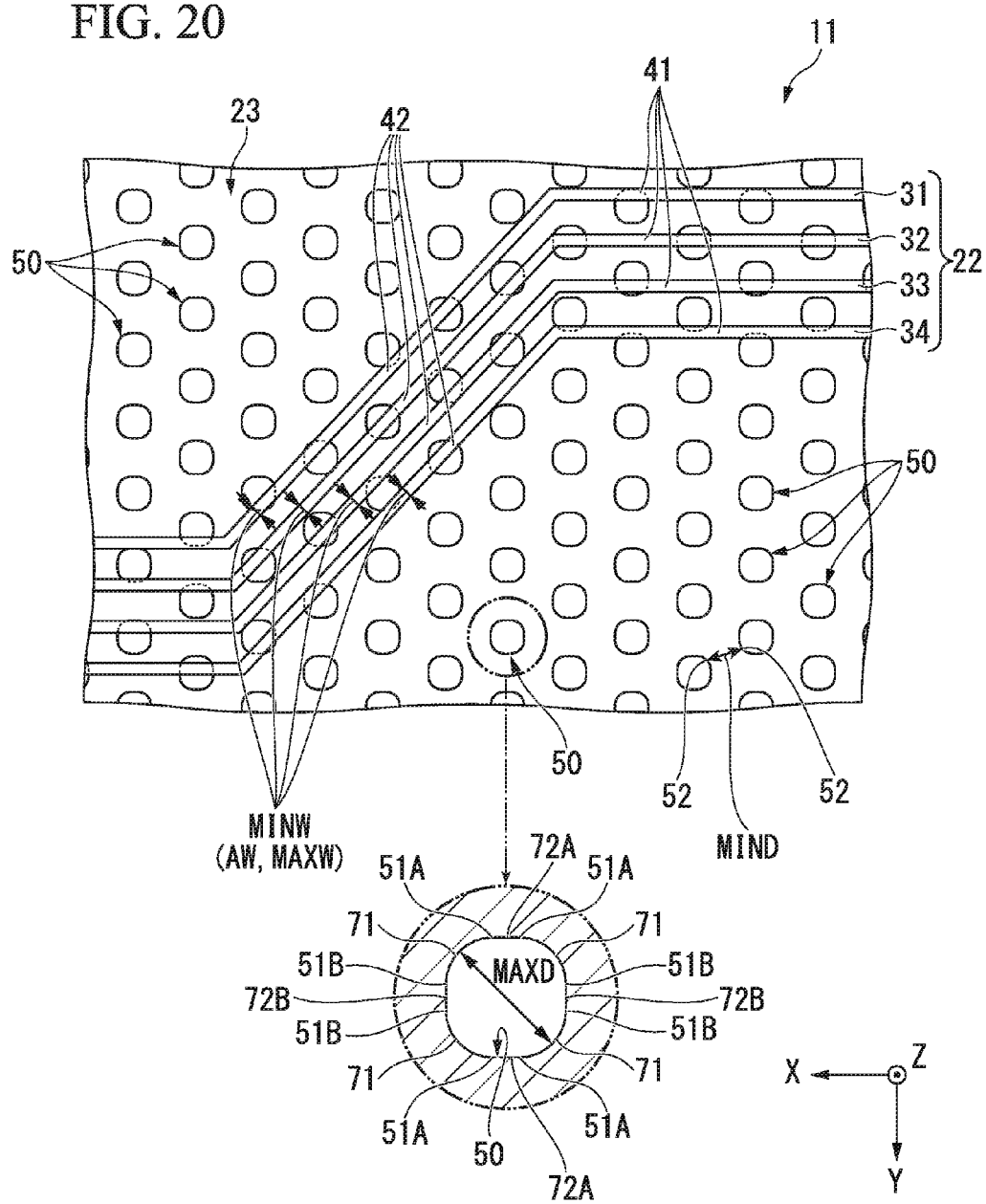
FIG. 20 is a plan view of a board according to a second modified example of the third embodiment.

FIG. 20 illustrates a board 11 according to a second modified example.

Each of a plurality of openings 50 of the present embodiment has a plurality of curves 71, a plurality of first straight lines 72A, a plurality of first corners 51A, a plurality of second straight lines 72B, and a plurality of second corners 51B. Also, because configurations of parts are substantially the same as those of the first modified example, redundant description thereof will be omitted.

Third Modified Example

Figure 21:
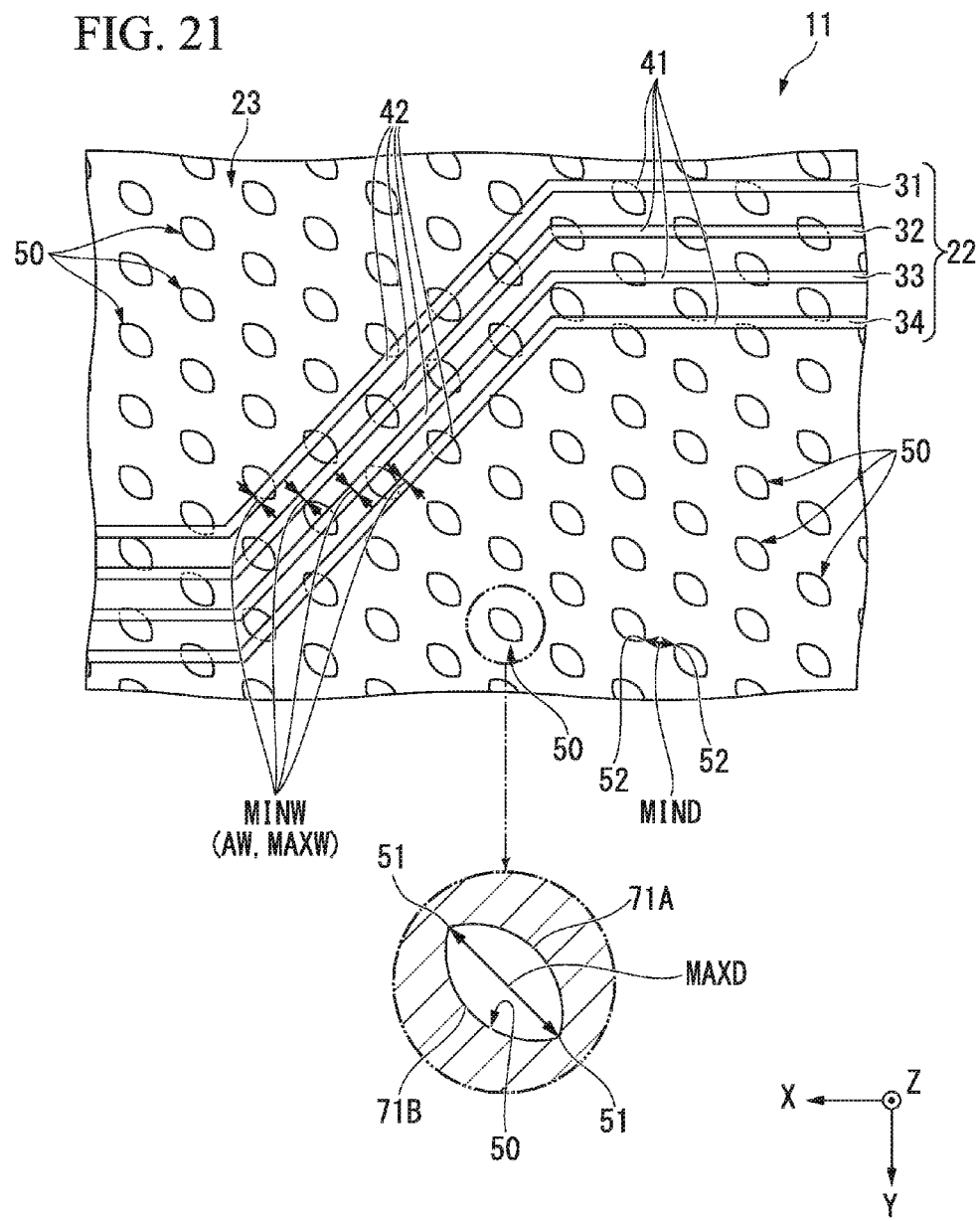
FIG. 21 is a plan view of a board according to a third modified example of the third embodiment.

FIG. 21 illustrates a board 11 according to a third modified example.

Each of a plurality of openings 50 of the present embodiment has a first curve 71A and a second curve 71B. The first curve 71A and the second curve 71B are curved arcs directed in directions opposite to each other. Both ends of the first curve 71A and both ends of the second curve 71B are connected to each other. The openings 50 are formed between the first curve 71A and the second curve 71B.

The first to third embodiments and the modified examples thereof have been described above. However, the configuration of the embodiment is not limited to the above-described examples.

Figure 22:
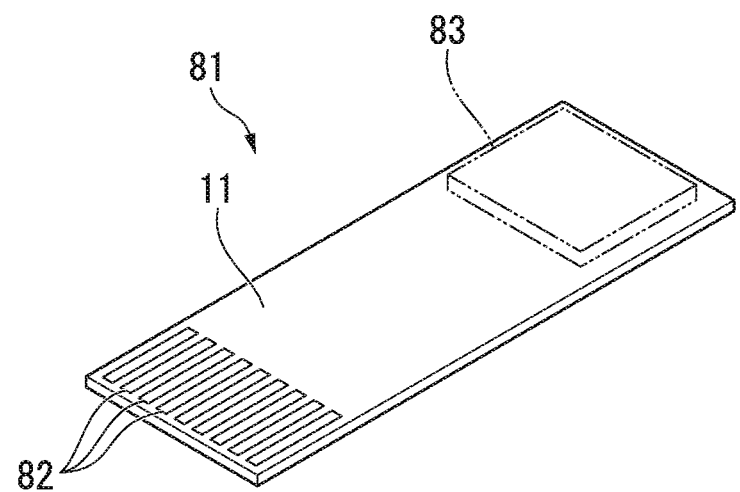
FIG. 22 is a perspective view of a printed wiring board according to the first to third embodiments.

For example, the configurations of the boards 11 of the first to third embodiments and the modified examples thereof are also applicable to a printed wiring board. FIG. 22 illustrates a flexible printed wiring board 81 as an example of the printed wiring board. The flexible printed wiring board 81 includes a board 11 of any one of the first to third embodiments and the modified examples thereof and terminals 82 provided on the surface of the board 11. For example, the terminals 82 are connectable to a connector mounted on an external circuit board, an interface of an external device, or the like. The board 11 has flexibility. For example, the ground layer 23 has a plurality of openings 50 and therefore the flexibility of the board 11 can be further improved. For example, an electronic part 83 such as a camera or a sensor may be mounted on the board 11. Also, the board 11 to which the configurations of the first to third embodiments and the modified examples thereof are applicable is not limited to a flexible printed wiring board, and may be a rigid board.

The plurality of openings 50 of the ground layer 23 may have a plurality of types of openings 50 (e.g., a combination of regular octagonal openings 50 and regular decagonal openings 50, etc.). The openings 50 are not limited to the regular polygons and may have star shapes or other shapes.

A relationship of the sizes of the openings 50 and the wiring widths of the signal lines 31, 32, 33, and 34 and a relationship of the distance between the openings 50 and the wiring widths of the signal lines 31, 32, 33, and 34 are not limited to the examples of the above-described embodiments.

According to at least one embodiment described above, the board includes a conductive line, a ground layer, and an insulator layer. The ground layer has a plurality of openings. The insulator layer electrically insulates the first conductive line and the ground layer. The plurality of openings has at least five corners and are regular polygonal different from regular hexagonal. According to this configuration, the design of the board can become flexible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A circuit board comprising:
   an insulating layer;
   a ground layer formed on a first surface of the insulating layer and including a plurality of openings arranged in first and second surface directions, each of the openings having a shape of a polygon having five or more sides; and
   a wiring layer formed on a second surface of the insulating layer opposite to the first surface.

2. The circuit board according to claim 1, wherein the polygon is a regular polygon.

3. The circuit board according to claim 1, wherein the polygon is a non-regular polygon.

4. The circuit board according to claim 1, wherein the polygon has seven or more sides.

5. The circuit board according to claim 1, wherein an angle between the first surface direction and the second surface direction is substantially 90 degree.

6. The circuit board according to claim 1, wherein an angle between the first surface direction and the second surface direction is substantially 60 degree.

7. The circuit board according to claim 1, wherein
a diagonal line of each opening extends in the first surface direction.

8. The circuit board according to claim 7, wherein
another diagonal line of each opening extends in the second surface direction.

9. The circuit board according to claim 7, wherein
no diagonal line of each opening extends in the second surface direction.

10. The circuit board according to claim 1, wherein
no diagonal line of each opening extends in the first surface direction and in the second surface direction.

11. The circuit board according to claim 1, wherein each of the openings has the same shape.

12. The circuit board according to claim 11, wherein
the wiring layer includes a plurality of wiring lines, and
a minimum width of a wiring line is smaller than a maximum width of the opening over which the wiring line passes.

13. The circuit board according to claim 11, wherein
the wiring layer includes a plurality of wiring lines, and
an average width of a wiring line is smaller than a maximum width of the opening over which the wiring line passes.

14. The circuit board according to claim 1, wherein
the wiring line passes over at least one corner of one of the openings.

15. The circuit board according to claim 1, wherein
the wiring line passes over at least one corner of two of the openings.

16. The circuit board according to claim 1, wherein
the wiring line passes over at least two corners of one of the openings.

17. A semiconductor device comprising:
a circuit board including
an insulating layer,
a ground layer formed on a first surface of the insulating layer and including a plurality of openings arranged in first and second surface directions, each of the openings having a shape of a polygon having five or more sides, and
a wiring layer formed on a second surface of the insulating layer opposite to the first surface; and
a semiconductor chip disposed on the circuit board and electrically connected to the ground layer and the wiring layer.

18. The semiconductor device according to claim 17, wherein
the wiring layer includes a pair of wiring lines that has a portion extending in parallel.

19. The semiconductor device according to claim 18, wherein
differential signals pass through the pair of wiring lines.

20. The semiconductor device according to claim 17, wherein
the circuit board is a flexible printed circuit (FPC).

* * * * *